US009494718B2

(12) United States Patent
Muellender et al.

(10) Patent No.: US 9,494,718 B2
(45) Date of Patent: Nov. 15, 2016

(54) MIRROR FOR THE EUV WAVELENGTH RANGE, SUBSTRATE FOR SUCH A MIRROR, PROJECTION OBJECTIVE FOR MICROLITHOGRAPHY COMPRISING SUCH A MIRROR OR SUCH A SUBSTRATE, AND PROJECTION EXPOSURE APPARATUS FOR MICROLITHOGRAPHY COMPRISING SUCH A PROJECTION OBJECTIVE

(75) Inventors: Stephan Muellender, Aalen (DE); Joern Weber, Aalen (DE);
(Continued)

(73) Assignee: Carl Zeiss SMT GmbH, Oberkochen (DE)

( * ) Notice: Subject to any disclaimer, the term of this patent is extended or adjusted under 35 U.S.C. 154(b) by 1020 days.

(21) Appl. No.: 13/525,233

(22) Filed: Jun. 15, 2012

(65) Prior Publication Data
US 2013/0038929 A1 Feb. 14, 2013

Related U.S. Application Data

(63) Continuation of application No. PCT/EP2010/067003, filed on Nov. 8, 2010.

(30) Foreign Application Priority Data

Dec. 15, 2009 (DE) .................. 10 2009 054 653

(51) Int. Cl.
*G02B 5/08* (2006.01)
*G02B 1/10* (2015.01)
(Continued)

(52) U.S. Cl.
CPC ............. *G02B 5/0891* (2013.01); *B82Y 30/00* (2013.01); *G02B 1/105* (2013.01); *G02B 5/0816* (2013.01);
(Continued)

(58) Field of Classification Search
CPC .................. G02B 1/105; G02B 5/0816; G02B 5/0891; G02B 5/08; B82Y 30/00;
(Continued)

(56) References Cited

U.S. PATENT DOCUMENTS 7,129,010 B2   10/2006 Alkemper et al.
7,920,323 B2 *  4/2011 Benoit et al. .................. 359/359
(Continued)

FOREIGN PATENT DOCUMENTS

DE         102004062289 A1   7/2006
EP             1387189 A2    2/2004
(Continued)

OTHER PUBLICATIONS

Office Action in corresponding Chinese Application No. 201080056967.1, mailed Sep. 11, 2014, along with an English translation.
(Continued)

*Primary Examiner* — Bumsuk Won
*Assistant Examiner* — Grant Gagnon
(74) *Attorney, Agent, or Firm* — Edell, Shapiro & Finnan, LLC

(57) ABSTRACT

A mirror ($1a$; $1a'$; $1b$; $1b'$; $1c$; $1c'$) for the EUV wavelength range and having a substrate (S) and a layer arrangement, wherein the layer arrangement includes at least one surface layer system (P''') consisting of a periodic sequence of at least two periods ($P_3$) of individual layers, wherein the periods ($P_3$) include two individual layers composed of different materials for a high refractive index layer (H''') and a low refractive index layer (L'''), wherein the layer arrangement includes at least one surface protecting layer (SPL, $L_p$) or at least one surface protecting layer system (SPLS) having a thickness of greater than 20 nm, and preferably greater than 50 nm.

27 Claims, 14 Drawing Sheets

(75) Inventors: Wilfried Clauss, Ulm (DE);
Hans-Jochen Paul, Aalen (DE);
Gerhard Braun, Ederheim (DE);
Sascha Migura, Aalen-Unterrombach (DE); Aurelian Dodoc, Heidenheim (DE); Christoph Zaczek, Heubach (DE); Gisela Von Blanckenhagen, Aalen (DE); Roland Loercher, Aalen-Hofherrnweiler (DE)

(51) Int. Cl.
*G03F 7/20* (2006.01)
*B82Y 30/00* (2011.01)

(52) U.S. Cl.
CPC ....... *G03F 7/70233* (2013.01); *G03F 7/70316* (2013.01); *G03F 7/70958* (2013.01)

(58) Field of Classification Search
CPC .............. G03F 7/70316; G03F 7/70958; G03F 7/70223
USPC .................................. 359/590–590
See application file for complete search history.

(56) References Cited

U.S. PATENT DOCUMENTS

| 7,959,310 | B2* | 6/2011 | Ehm et al. ................ 359/846 |
| 8,488,103 | B2* | 7/2013 | Pazidis et al. .............. 355/67 |
| 2003/0214735 | A1 | 11/2003 | Masaki et al. |
| 2004/0233519 | A1* | 11/2004 | Bijkerk et al. ............. 359/359 |
| 2005/0063451 | A1 | 3/2005 | Abe et al. |
| 2005/0195488 | A1* | 9/2005 | McCabe et al. ............. 359/603 |
| 2007/0171327 | A1 | 7/2007 | Matsumodo et al. |
| 2007/0177274 | A1 | 8/2007 | Masaki |
| 2008/0088916 | A1 | 4/2008 | Benoit et al. |
| 2008/0149854 | A1 | 6/2008 | Van Herpen et al. |
| 2009/0141356 | A1 | 6/2009 | Masaki et al. |
| 2009/0323180 | A1* | 12/2009 | Weber ................. B32B 7/02 359/359 |
| 2011/0019174 | A1* | 1/2011 | Soer et al. ................. 355/71 |
| 2011/0222144 | A1* | 9/2011 | Enkisch et al. ............. 359/359 |

FOREIGN PATENT DOCUMENTS

| JP | 62226625 A | 10/1987 |
| JP | 2003318094 A | 11/2003 |
| JP | 2003329820 A | 11/2003 |
| JP | 2007198782 A | 8/2007 |

OTHER PUBLICATIONS

Office Action in corresponding Taiwanese Application No. 099143808, mailed Oct. 1, 2014, along with an English translation.

International Search Report and Written Opinion in corresponding PCT Application No. PCT/EP2010/067003 dated Feb. 7, 2011.

Japanese Office Action for counterpart Japanese Patent Application No. 2012-543554, dated Aug. 13, 2013.

Office Action in corresponding Chinese Application No. 201080056967.1, mailed Jan. 13, 2014, along with an English translation.

\* cited by examiner

MIRROR FOR THE EUV WAVELENGTH RANGE, SUBSTRATE FOR SUCH A MIRROR, PROJECTION OBJECTIVE FOR MICROLITHOGRAPHY COMPRISING SUCH A MIRROR OR SUCH A SUBSTRATE, AND PROJECTION EXPOSURE APPARATUS FOR MICROLITHOGRAPHY COMPRISING SUCH A PROJECTION OBJECTIVE

CROSS REFERENCE TO RELATED APPLICATIONS

This application is a Continuation of International Application No. PCT/EP2010/067003, filed on Nov. 8, 2010, which was published under PCT Article 21(2) in English, and which claims the benefit of German Application No. 10 2009 054 653.7, filed Dec. 15, 2009. The entire disclosures of each of these applications are hereby incorporated into the present Continuation Application by reference.

FIELD OF AND BACKGROUND OF THE INVENTION

The invention relates to a mirror for the extreme-ultraviolet (EUV) wavelength range and a substrate for such a mirror. Furthermore, the invention relates to a projection objective for microlithography comprising such a mirror or such a substrate. Moreover, the invention relates to a projection exposure apparatus for microlithography comprising such a projection objective.

Projection exposure apparatuses for microlithography for the EUV wavelength range have to rely on the assumption that the mirrors used for the exposure or imaging of a mask into an image plane have a high reflectivity since, firstly, the product of the reflectivity values of the individual mirrors determines the total transmission of the projection exposure apparatus and since, secondly, the light power of EUV light sources is limited. In order to obtain a high reflectivity it is also necessary to avoid losses on account of stray light, which leads to stringent requirements made of the surface roughness of such mirrors in the so-called HSFR range, see U. Dinger et al. "Mirror substrates for EUV-lithography: progress in metrology and optical fabrication technology" in Proc. SPIE Vol. 4146, 2000, in particular for the definition of the surface roughness in the HSFR range with spatial wavelengths of the roughness of 10 nm to 1 µm and in the MSFR range with spatial wavelengths of the roughness of 1 µm to 1 mm. Furthermore, such mirrors have to ensure the high reflectivity values and the desired optical imaging quality even over a period of several years under continuous irradiation with high-intensity EUV light.

Mirrors for the EUV wavelength range around 13 nm having high reflectivity values are known from DE 101 55 711 A1, for example. The mirrors described therein consist of a layer arrangement which is applied on a substrate and which has a sequence of individual layers, wherein the layer arrangement comprises a plurality of surface layer systems each having a periodic sequence of at least two individual layers of different materials that form a period, wherein the number of periods and the thickness of the periods of the individual layer systems decrease from the substrate toward the surface. Such mirrors have a reflectivity of greater than 30% in the case of an angle of incidence interval of between 0° and 20°.

In this case, the angle of incidence is defined as the angle between the direction of incidence of a light ray and the normal to the surface of the mirror at the point where the light ray impinges on the mirror. In this case, the angle of incidence interval results from the angle interval between the largest and the smallest angle of incidence respectively considered for a mirror.

OBJECTS AND SUMMARY OF THE INVENTION

What is disadvantageous about the abovementioned layers, however, is that their reflectivity in the angle of incidence interval specified is not constant, but rather varies. A variation of the reflectivity of a mirror over the angles of incidence is disadvantageous, however, for the use of such a mirror at locations with high angles of incidence and with high angle of incidence changes in a projection objective for microlithography since such a variation leads for example to an excessively large variation of the pupil apodization of such a projection objective. In this case, the pupil apodization is a measure of the intensity fluctuation over the exit pupil of a projection objective.

What is furthermore disadvantageous about the abovementioned layers is that the latter transmit too much EUV light to the substrate, as a result of which the substrate is exposed to high doses of EUV light over a long period of time. However, under high doses of EUV light, substrates for EUV mirrors composed of materials such as e.g. Zerodur® from Schott AG or ULE® from Corning Inc. tend toward densification of the order of magnitude of a few percent by volume. In the case of generally non-uniform irradiation of the mirrors, said densification leads to a non-uniform change in their surface form, as a result of which the optical imaging properties of the mirrors are changed in an undesirable manner during the operating period.

Therefore, it is an object of the invention to provide a mirror for the EUV wavelength range which, even at high doses of EUV light, has a high long-term stability of its optical properties during the operating period of from a few months to a few years.

This object is achieved according to one formulation of the invention by a mirror for the EUV wavelength range comprising a substrate and a layer arrangement, wherein the layer arrangement comprises at least one surface layer system consisting of a periodic sequence of at least two periods of individual layers, wherein the periods comprise two individual layers composed of different materials for a high refractive index layer and a low refractive index layer, wherein the layer arrangement comprises at least one surface protecting layer or at least one surface protecting layer system having a thickness of greater than 20 nm, in particular 50 nm, and wherein the transmission of EUV radiation through the layer arrangement amounts to less than 2%, in particular less than 0.2%.

The terms high refractive index and low refractive index are in this case, in the EUV wavelength range, relative terms with regard to the respective partner layer in a period of a surface layer system. In the EUV wavelength range, surface layer systems generally function only if a layer that acts with optically high refractive index is combined with an optically lower refractive index layer relative thereto as main constituent of a period of the surface layer system.

It has been recognized according to the invention that, in order to protect the substrate from excessively high doses of EUV light, it suffices to design the layer arrangement on the substrate of the mirror such that only a fraction of the EUV light reaches the substrate. For this purpose, either the layer arrangement or the surface layer systems of the layer arrangement can be provided with a corresponding number of periods of layers or a surface protecting layer (SPL) or a surface protecting layer system (SPLS) is used, such that at all events the transmission of EUV radiation through the layer arrangement to the substrate amounts to less than 2%, in particular less than 0.2%.

Furthermore, the object of the present invention is achieved, according to a further formulation, by a mirror for the EUV wavelength range comprising a substrate and a layer arrangement, wherein the layer arrangement comprises at least one surface layer systems consisting of a periodic sequence of at least two periods of individual layers, wherein the periods comprise two individual layers composed of different materials for a high refractive index layer and a low refractive index layer, and wherein the layer arrangement comprises at least one surface protecting layer SPL or at least one surface protecting layer system SPLS having a thickness of greater than 20 nm, in particular 50 nm, wherein the surface protecting layer SPL or the surface protecting layer system SPLS experience an irreversible change in volume of less than 1%, in particular less than 0.2%, under EUV radiation.

In this case, an irreversible change in volume under EUV radiation is understood to mean not the reversible change in volume on account of thermal expansion, but rather the long-term irreversible change in volume on account of structural changes in the material under consideration caused by high doses of EUV radiation.

It has been recognized according to the invention that, besides protection of the substrate, for which a 20 nm thick surface protecting layer SPL or a 20 nm thick surface protecting layer system SPLS may already suffice depending on choice of material, it must also be taken into consideration that the surface protecting layer SPL or the surface protecting layer system SPLS must remain stable even under EUV radiation at high doses that are accumulated over the lifetime of a lithography apparatus. Otherwise, the problem of the irreversible change in volume is merely shifted from the substrate to the surface protecting layer or the surface protecting layer system, respectively.

Furthermore, the object of the present invention is achieved, according to yet another formulation, by a mirror for the EUV wavelength range comprising a substrate and a layer arrangement, wherein the layer arrangement comprises at least one surface layer systems consisting of a periodic sequence of at least two periods of individual layers, wherein the periods comprise two individual layers composed of different materials for a high refractive index layer and a low refractive index layer. Furthermore, the layer arrangement in this case comprises at least one surface protecting layer or at least one surface protecting layer system having a thickness of greater than 20 nm, in particular of greater than 50 nm, wherein the surface protecting layer or the surface protecting layer system is provided for preventing an irreversible alteration of the surface of the substrate under EUV radiation of more than 0.1 nm measured in the normal direction at a location within the irradiated region of the substrate relative to the surface of the substrate at a location outside the irradiated region measured in the same direction, and at the same time for exerting a tensile stress for compensation of layer stresses in the layer arrangement.

In this case it has been recognized by the inventors that, besides protection of the substrate, for which a 20 nm thick surface protecting layer SPL or a 20 nm thick surface protecting layer system SPLS may already suffice depending on choice of material, it must also be taken into consideration that the surface protecting layer SPL or the surface protecting layer system SPLS is at the same time adapted for compensation of the layer stresses in the layer arrangement since otherwise the substrate bends impermissibly on account of the layer stresses. Consequently, particularly in the design of a surface protecting layer system, the resultant layer stress has to be concomitantly taken into account in the optimization. Furthermore, through the choice of material in the case of the surface protecting layer SPL and in the case of the surface protecting layer system SPLS, care must be taken to ensure that these are not altered in the case of EUV radiation at high doses since this inevitably entails an alteration of the layer stress and thus of the surface form.

In one embodiment, the layer arrangement of the mirror comprises at least one layer which is formed from or as a compound is composed of a material from the group: nickel, carbon, boron carbide, cobalt, beryllium, silicon, silicon oxides. These materials are suitable individually or in combination with one another for a surface protecting layer SPL or a surface protecting layer system SPLS. Even alloys like nickel-boron, nickel-silicon, nickel-molybdenum, nickel-vanadium, nickel-silicon-boron are compounds in the sense of this application, which could be used as a surface protecting layer SPL or which could be combined together with silicon, molybdenum or chromium within a surface protecting layer system SPLS. In order to achieve a transmission of EUV radiation through the layer arrangement to the substrate of less than 0.2% a thickness of more than 200 nm for the surface protecting layer SPL or for the surface protecting layer system SPLS made of the mentioned materials would be enough to ensure this transmission without taking into account the transmission effect of the other surface layer systems of the mirror.

In a further embodiment, the layer arrangement of a mirror comprises at least three surface layer systems, wherein the number of periods of the surface layer system that is situated closest to the substrate is greater than for the surface layer system that is most distant from the substrate and/or is greater than for the surface layer system that is second most distant from the substrate.

These measures foster a decoupling of the reflection properties of the mirror from layers lying below the layer arrangement or the substrate, such that it is possible to use other layers with other functional properties or other substrate materials below the layer arrangement of the mirror.

Firstly, it is thus possible to avoid perturbing effects of the layers lying below the layer arrangement or of the substrate on the optical properties of the mirror, and in this case in particular on the reflectivity, and, secondly, it is thereby possible for layers lying below the layer arrangement or the substrate to be protected from the EUV radiation in addition to the measures already mentioned above.

In this case, it should be taken into consideration that the properties of reflectivity, transmission and absorption of a layer arrangement behave nonlinearly with respect to the number of periods of the layer arrangement; the reflectivity, in particular, exhibits a saturation behaviour toward a limit value with regard to the number of periods of a layer arrangement. The abovementioned surface protecting layer SPL or the abovementioned surface protecting layer system SPLS can also thus be used to the effect that the required number of periods of a layer arrangement is not permitted to increase immensely for the protection of the layers lying below the layer arrangement or of the substrate from EUV radiation, but rather is limited to the required number of periods for achieving the reflectivity properties.

In another embodiment, the layer arrangement comprises an amorphous layer in particular comprising at least silicon or quartz having a thickness of greater than 100 nm, in particular of greater than 2 µm, which was deposited by a CVD method, in particular a PICVD, PACVD or PECVD method. Such layers exhibit long-term stability under EUV light and can be polished well even in the case of a surface protecting layer system SPLS or a substrate with a high surface roughness below the amorphous layer.

In one embodiment, the layer arrangement comprises an amorphous layer, wherein the layer has a surface roughness of less than 0.5 nm rms HSFR, in particular less than 0.2 nm rms HSFR. Such layers firstly lead, as mentioned in the introduction, to low stray light losses of the mirror and, secondly, can be used to provide the substrate material, which is generally difficult to polish, with a surface layer that can be polished well. Further it is possible to use in combination with this amorphous layer other substrate materials like invar for example, which can withstand even high EUV radiation doses. Such amorphous layers can be polished mechanically or by ion bombardment.

In a further embodiment, the layer arrangement comprises at least one surface protecting layer system SPLS consisting of a periodic sequence of at least two periods of individual layers, where the periods comprise two individual layers composed of different materials for a high refractive index layer and a low refractive index layer, wherein the materials of the two individual layers forming the periods are either nickel and silicon or cobalt and beryllium. What is advantageous about such surface protecting layer systems SPLS by comparison with an individual surface protecting layer SPL is that although the total thickness of the absorbent layers of the surface protecting layer system SPLS corresponds to the thickness of the individual surface protecting layer SPL for the absorption effect, said absorbent layers, by comparison with said surface protecting layer, are interrupted by other layers composed of other material, as a result of which the crystal growth in the layers of the surface protecting layer system SPLS is interrupted by comparison with the crystal growth in the surface protecting layer SPL. This makes it possible to provide very smooth surfaces without high stray light losses or to produce said surfaces during the coating process using, for example, an assisting ion bombardment.

In another embodiment, the individual layers of the surface protecting layer system SPLS are separated by at least one barrier layer and the barrier layer consists of a material which is selected from or as a compound is composed of the group of materials: $B_4C$, C, Si nitride, Si carbide, Si boride, Mo nitride, Mo carbide, Mo boride, Ru nitride, Ru carbide and Ru boride. These materials mentioned prevent the interdiffusion of the individual layers of the SPLS.

In a further embodiment, the layer arrangement comprises at least one surface protecting layer system SPLS consisting of a periodic sequence of at least two periods of individual layers, wherein the periods comprise two individual layers composed of different materials for a low refractive index layer and a barrier layer. Such surface protecting layer systems SPLS are extremely simple in their construction since the high refractive index layer or the spacer has been dispensed with.

In another embodiment, the layer arrangement comprises at least one surface protecting layer system SPLS consisting of a periodic sequence of at least two periods of individual layers, wherein the periods comprise two individual layers composed of different materials for a low refractive index layer and a barrier layer, and wherein the material for the low refractive index layer consists of nickel and the material for the barrier layer is selected from or as a compound is composed of the group of materials: $B_4C$, C, Si nitride, Si carbide, Si boride, Mo nitride, Mo carbide, Mo boride, Ru nitride, Ru carbide and Ru boride. Such surface protecting layer systems SPLS constitute a preferred material combination of a simple surface protecting layer system SPLS.

In a further embodiment, the at least one surface protecting layer system SPLS has layers having a surface roughness of less than 0.5 nm rms HSFR, in particular of less than 0.2 nm rms HSFR. Such layers lead, as mentioned in the introduction, to low stray light losses and can be produced during the coating process for example by using assisting ion bombardment.

In one embodiment, the mirror for the EUV wavelength range comprises a substrate and a layer arrangement, wherein the layer arrangement comprises a plurality of surface layer systems. In this case, the surface layer systems each consist of a periodic sequence of at least two periods of individual layers. In this case, the periods comprise two individual layers composed of different materials for a high refractive index layer and a low refractive index layer and have within each surface layer system a constant thickness that deviates from a thickness of the periods of an adjacent surface layer system. In this case, the surface layer system that is second most distant from the substrate has a sequence of the periods such that the first high refractive index layer of the surface layer system that is most distant from the substrate directly succeeds the last high refractive index layer of the surface layer system that is second most distant from the substrate and/or the surface layer system that is most distant from the substrate has a number of periods that is greater than the number of periods for the surface layer system that is second most distant from the substrate.

In this case, the surface layer systems of the layer arrangement of the mirror according to the invention succeed one another directly and are not separated by a further layer system. Furthermore, in the context of the present invention, a surface layer system is distinguished from an adjacent surface layer system, even given otherwise identical division of the periods between high and low refractive index layers, if a deviation by more than 0.1 nm is present as deviation in the thickness of the periods of the adjacent surface layer systems since, starting from a difference of 0.1 nm, it is possible to assume a different optical effect of the surface layer systems with otherwise identical division of the periods between high and low refractive index layers.

It has been recognized that in order to achieve a high and uniform reflectivity across a large angle of incidence interval, the number of periods for the surface layer system that is most distant from the substrate must be greater than that for the surface layer system that is second most distant from the substrate. Furthermore it has been recognized that, in order to achieve a high and uniform reflectivity across a large angle of incidence interval, as an alternative or in addition to the measure mentioned above, the first high refractive index layer of the surface layer system that is most distant from the substrate should directly succeed the last high refractive index layer of the surface layer system that is second most distant from the substrate.

In a further embodiment the mirror for the EUV wavelength range comprises a substrate and a layer arrangement, wherein the layer arrangement comprises a plurality of surface layer systems. In this case, the surface layer systems each consist of a periodic sequence of at least two periods of individual layers. In this case, the periods comprise two individual layers composed of different materials for a high refractive index layer and a low refractive index layer and have within each surface layer system a constant thickness that deviates from a thickness of the periods of an adjacent surface layer system. In this case, the surface layer system that is second most distant from the substrate has a sequence of the periods such that the first high refractive index layer of the surface layer system that is most distant from the substrate directly succeeds the last high refractive index layer of the surface layer system that is second most distant from the substrate.

It has been recognized that, in order to achieve a high and uniform reflectivity across a large angle of incidence interval, the influence of layers situated below the layer arrangement or of the substrate must be reduced. This is necessary primarily for a layer arrangement in which the surface layer system that is second most distant from the substrate has a sequence of the periods such that the first high refractive index layer of the surface layer system that is most distant from the substrate directly succeeds the last high refractive index layer of the surface layer system that is second most distant from the substrate. One simple possibility for reducing the influence of layers lying below the layer arrangement or of the substrate consists in designing the layer arrangement such that the latter transmits as little EUV radiation as possible to the layers lying below the layer arrangement. This affords the possibility for said layers lying below the layer arrangement or the substrate to make a significant contribution to the reflectivity properties of the mirror.

In one embodiment, the surface layer systems are in this case all constructed from the same materials for the high and low refractive index layers since this simplifies the production of mirrors.

A mirror for the EUV wavelength range in which the number of periods of the surface layer system that is most distant from the substrate corresponds to a value of between 9 and 16, and a mirror for the EUV wavelength range in which the number of periods of the surface layer system that is second most distant from the substrate corresponds to a value of between 2 and 12, lead to a limitation of the layers required in total for the mirror and thus to a reduction of the complexity and the risk during the production of the mirror.

Furthermore, it has been recognized that it is possible to achieve particularly high reflectivity values for a layer arrangement in the case of a small number of surface layer systems if, in this case, the period for the surface layer system that is most distant from the substrate has a thickness of the high refractive index layer which amounts to more than 120% of the thickness, in particular more than double the thickness, of the high refractive index layer of the period for the surface layer system that is second most distant from the substrate.

It is likewise possible to achieve particularly high reflectivity values for a layer arrangement in the case of a small number of surface layer systems in a further embodiment if the period for the surface layer system that is most distant from the substrate has a thickness of the low refractive index layer which is less than 80%, in particular less than two thirds of the thickness of the low refractive index layer of the period for the surface layer system that is second most distant from the substrate.

In a further embodiment, a mirror for the EUV wavelength range has, for the surface layer system that is second most distant from the substrate, a thickness of the low refractive index layer of the period which is greater than 4 nm, in particular greater than 5 nm. As a result of this it is possible that the layer design can be adapted not only with regard to the reflectivity per se, but also with regard to the reflectivity of s-polarized light with respect to the reflectivity of p-polarized light over the angle of incidence interval striven for. Primarily for layer arrangements which consist of only two surface layer systems, the possibility is thus afforded of performing a polarization adaptation despite limited degrees of freedom as a result of the limited number of surface layer systems.

In another embodiment, a mirror for the EUV wavelength range has a thickness of the periods for the surface layer system that is most distant from the substrate of between 7.2 nm and 7.7 nm. It is thereby possible to realize particularly high uniform reflectivity values for large angle of incidence intervals.

Furthermore, a further embodiment has an additional intermediate layer or an additional intermediate layer arrangement between the layer arrangement of the mirror and the substrate, which serves for the stress compensation of the layer arrangement. By making use of such stress compensation, it is possible to avoid deformation of the mirror during the application of the layers.

In another embodiment, the two individual layers forming a period consist either of the materials molybdenum (Mo) and silicon (Si) or of the materials ruthenium (Ru) and silicon (Si). It is thereby possible to achieve particularly high reflectivity values and at the same time to realize production engineering advantages since only two different materials are used for producing the surface layer systems of the layer arrangement of the mirror.

In this case, in a further embodiment, said individual layers are separated by at least one barrier layer, wherein the barrier layer consists of a material which is selected from or as a compound is composed of the group of materials: $B_4C$, C, Si nitride, Si carbide, Si boride, Mo nitride, Mo carbide, Mo boride, Ru nitride, Ru carbide and Ru boride. Such a barrier layer suppresses the interdiffusion between the two individual layers of a period, thereby increasing the optical contrast in the transition of the two individual layers. With the use of the materials molybdenum and silicon for the two individual layers of a period, one barrier layer above the Si layer, as viewed from the substrate, suffices in order to provide for a sufficient contrast. The second barrier layer above the Mo layer can be dispensed with in this case. In this respect, at least one barrier layer for separating the two individual layers of a period should be provided, wherein the at least one barrier layer may perfectly well be constructed from various ones of the above-indicated materials or the compounds thereof and may in this case also exhibit a layered construction of different materials or compounds.

Barrier layers which comprise the material $B_4C$ and have a thickness of between 0.35 nm and 0.8 nm, preferably between 0.4 nm and 0.6 nm, lead in practice to high reflectivity values of the layer arrangement. Particularly in the case of surface layer systems composed of ruthenium and silicon, barrier layers composed of $B_4C$ exhibit a maximum of reflectivity in the case of values of between 0.4 nm and 0.6 nm for the thickness of the barrier layer. This is particularly true in the case of a mono-stack composed of ruthenium and silicon as the surface layer system serving for the reflectivity of the EUV mirror.

In a further embodiment, a mirror according to the invention comprises a covering layer system comprising at least one layer composed of a chemically inert material, which terminates the layer arrangement of the mirror. The mirror is thereby protected against ambient influences.

In another embodiment, the mirror has a thickness factor of the layer arrangement along the mirror surface having values of between 0.9 and 1.05, in particular having values of between 0.933 and 1.018. It is thereby possible for different locations of the mirror surface to be adapted in a more targeted fashion to different angles of incidence that occur there. In this case, the thickness factor can also comprise the surface protecting layer SPL or the surface protecting layer system SPLS, and the abovementioned additional intermediate layer or the abovementioned additional intermediate layer arrangement for stress compensation.

In this case, the thickness factor is the factor with which all the thicknesses of the layers of a given layer design, in multiplied fashion, are realized at a location on the substrate. A thickness factor of 1 thus corresponds to the nominal layer design.

The thickness factor as a further degree of freedom makes it possible for different locations of the mirror to be adapted in a more targeted fashion to different angle of incidence intervals that occur there, without the layer design of the mirror per se having to be changed, with the result that the mirror ultimately yields, for higher angle of incidence intervals across different locations on the mirror, higher reflectivity values than are permitted by the associated layer design per se given a fixed thickness factor of 1. By adapting the thickness factor, it is thus also possible, over and above ensuring high angles of incidence, to achieve a further reduction of the variation of the reflectivity of the mirror according to the invention over the angles of incidence.

In a further embodiment, the thickness factor of the layer arrangement at locations of the mirror surface correlates with the maximum angle of incidence that occurs there, since, for a higher maximum angle of incidence, a higher thickness factor is useful for the adaptation.

In a further formulation of the invention, the object is addressed with a substrate for a mirror for the EUV wavelength range, wherein at least one surface protecting layer SPL or at least one surface protecting layer system SPLS having a thickness of greater than 20 nm, in particular 50 nm, protects the substrate from an irreversible change of volume under EUV radiation or protects the substrate from incident EUV radiation, such that less than 2%, in particular less than 0.2%, of the incident EUV radiation reaches the substrate.

It has been recognized that, for protecting the substrate, a 20 nm thick surface protecting layer SPL or a 20 nm thick surface protecting layer system SPLS may already suffice, depending on choice of material, for preventing the irreversible change in volume of the substrate in the case of high doses of EUV radiation.

Yet another formulation of the present invention provides a substrate for a mirror for the EUV wavelength range, wherein at least one surface protecting layer SPL or at least one surface protecting layer system SPLS having a thickness of greater than 20 nm, in particular of greater than 50 nm, is provided on the substrate for preventing an irreversible alteration of the surface of the substrate under EUV radiation of more than 0.1 nm measured in the normal direction at a location within the irradiated region of the substrate relative to the surface of the substrate at a location outside the irradiated region measured in the same direction, and at the same time for exerting a tensile stress for compensation of layer stresses of further layers to be applied on the substrate.

In this case it has been recognized that, besides protection of the substrate, for which a 20 nm thick surface protecting layer SPL or a 20 nm thick surface protecting layer system SPLS may already suffice depending on choice of material, it must also be taken into consideration that the surface protecting layer SPL or the surface protecting layer system SPLS is at the same time adapted for compensation of layer stresses of further layers to be applied on the substrate since otherwise the substrate bends impermissibly on account of the layer stresses. Consequently, particularly in the design of a surface protecting layer system, the resultant layer stress has to be concomitantly taken into account in the optimization of all layers to be applied. Furthermore, through the choice of material in the case of the surface protecting layer SPL and in the case of the surface protecting layer system SPLS, care must be taken to ensure that these are not altered in the case of EUV radiation at high doses since this inevitably entails an alteration of the layer stress and thus of the surface form.

In one embodiment, the substrate for a mirror for the EUV wavelength range has at least one surface protecting layer SPL or at least one layer of a surface protecting layer system SPLS which is formed from or as a compound is composed of a material from the group: nickel, carbon, boron carbide, cobalt, beryllium, silicon, silicon oxides.

Furthermore, another formulation of the invention addresses the object of the invention with a projection objective comprising at least one mirror according to the invention or a substrate according to the invention.

An associated projection exposure apparatus according to the invention for microlithography comprises such a projection objective.

Further features and advantages of the invention will become apparent from the following description of exemplary embodiments of the invention with reference to the figures, and from the claims. The individual features can be realized in each case individually by themselves or in a plurality of combinations, as desired in view of the particular attributes being considered.

BRIEF DESCRIPTION OF THE DRAWINGS

Exemplary embodiments of the invention are explained in greater detail below with reference to the figures, in which.

DETAILED DESCRIPTION OF PREFERRED EMBODIMENTS

Respective mirrors 1a, 1a', 1b, 1b', 1c and 1c' embodying aspects of the invention are described below with reference to FIGS. 1, 1a, 2, 2a, 3 and 3a, the corresponding features of the mirrors bearing the same reference signs in the figures. Furthermore, the corresponding features or properties of these mirrors according to aspects of the invention are explained in summary for FIGS. 1 to 3a below following the description concerning FIG. 3a.

Figure 1:
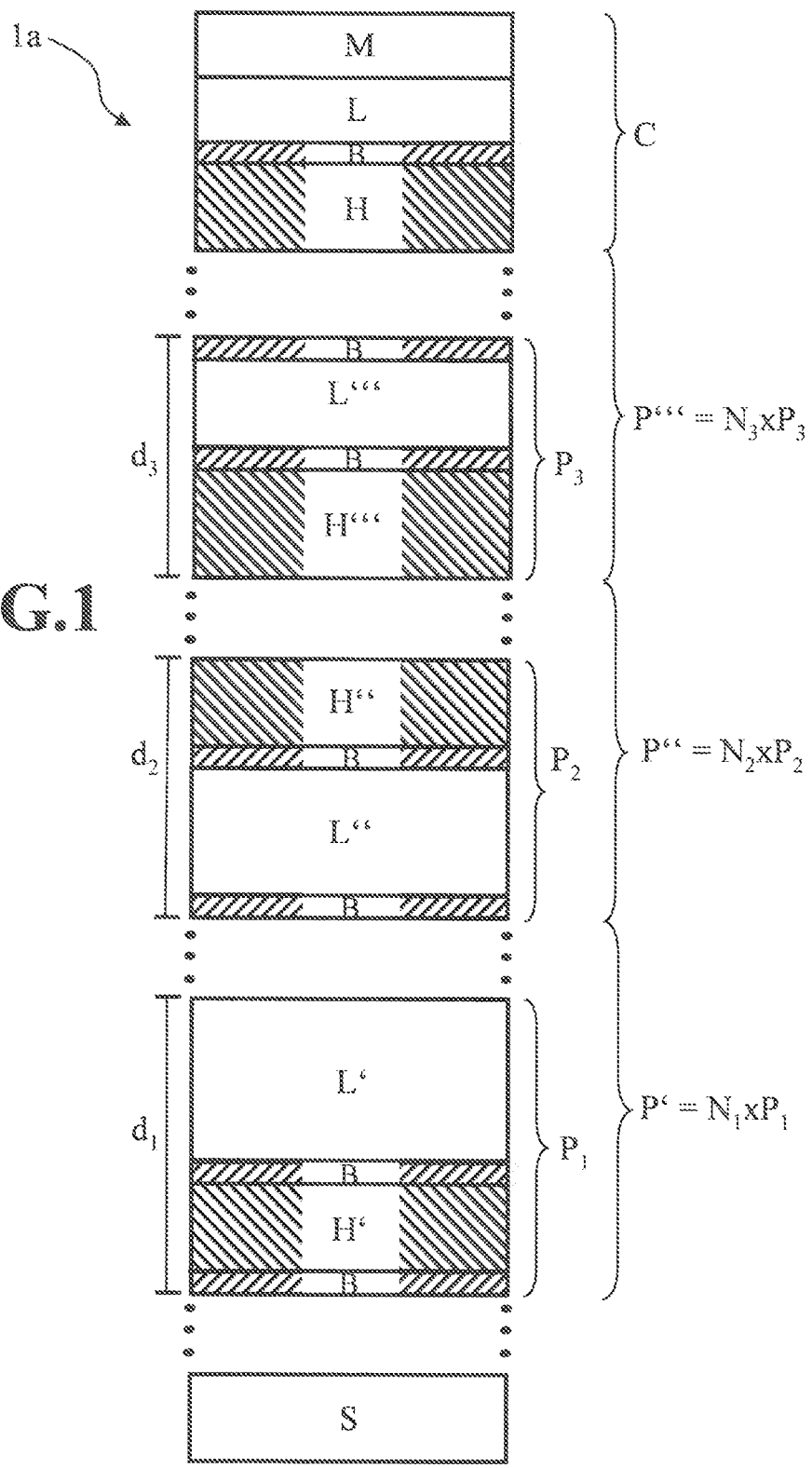
FIG. 1 shows a schematic illustration of a first mirror according to the invention.

FIG. 1 shows a schematic illustration of a mirror 1a according to the invention for the EUV wavelength range comprising a substrate S and a layer arrangement. In this case, the layer arrangement comprises a plurality of surface layer systems P', P" and P'" each consisting of a periodic sequence of at least two periods $P_1$, $P_2$ and $P_3$ of individual layers, wherein the periods $P_1$, $P_2$ and $P_3$ comprise two individual layers composed of different materials for a high refractive index layer H', H" and H'" and a low refractive index layer L', L" and L'" and have within each surface layer system P', P" and P'" a constant thickness $d_1$, $d_2$ and $d_3$ that deviates from a thickness of the periods of an adjacent surface layer system. In this case, the surface layer system P'" that is most distant from the substrate has a number $N_3$ of periods $P_3$ that is greater than the number $N_2$ of periods $P_2$ for the surface layer system P" that is second most distant from the substrate. In addition, the surface layer system P" that is second most distant from the substrate has a sequence of the periods $P_2$ such that the first high refractive index layer H'" of the surface layer system P'" that is most distant from the substrate directly succeeds the last high refractive index layer H" of the surface layer system P" that is second most distant from the substrate.

Consequently, in FIG. 1, the order of the high H" and low refractive index L" layers within the periods $P_2$ in the surface layer system P" that is second most distant from the substrate is reversed relative to the order of the high H', H'" and low refractive index L', L'" layers within the other periods $P_1$, $P_3$ of the other surface layer systems P', P'", such that the first low refractive index layer L" of the surface layer system P" that is second most distant from the substrate also optically actively succeeds the last low refractive index layer L' of the surface layer system P' that is situated closest to the substrate. Therefore, the surface layer system P" that is second most distant from the substrate in FIG. 1 also differs in the order of the layers from all the other surface layer systems in FIGS. 2 and 3 that are described below.

Figure 1A:
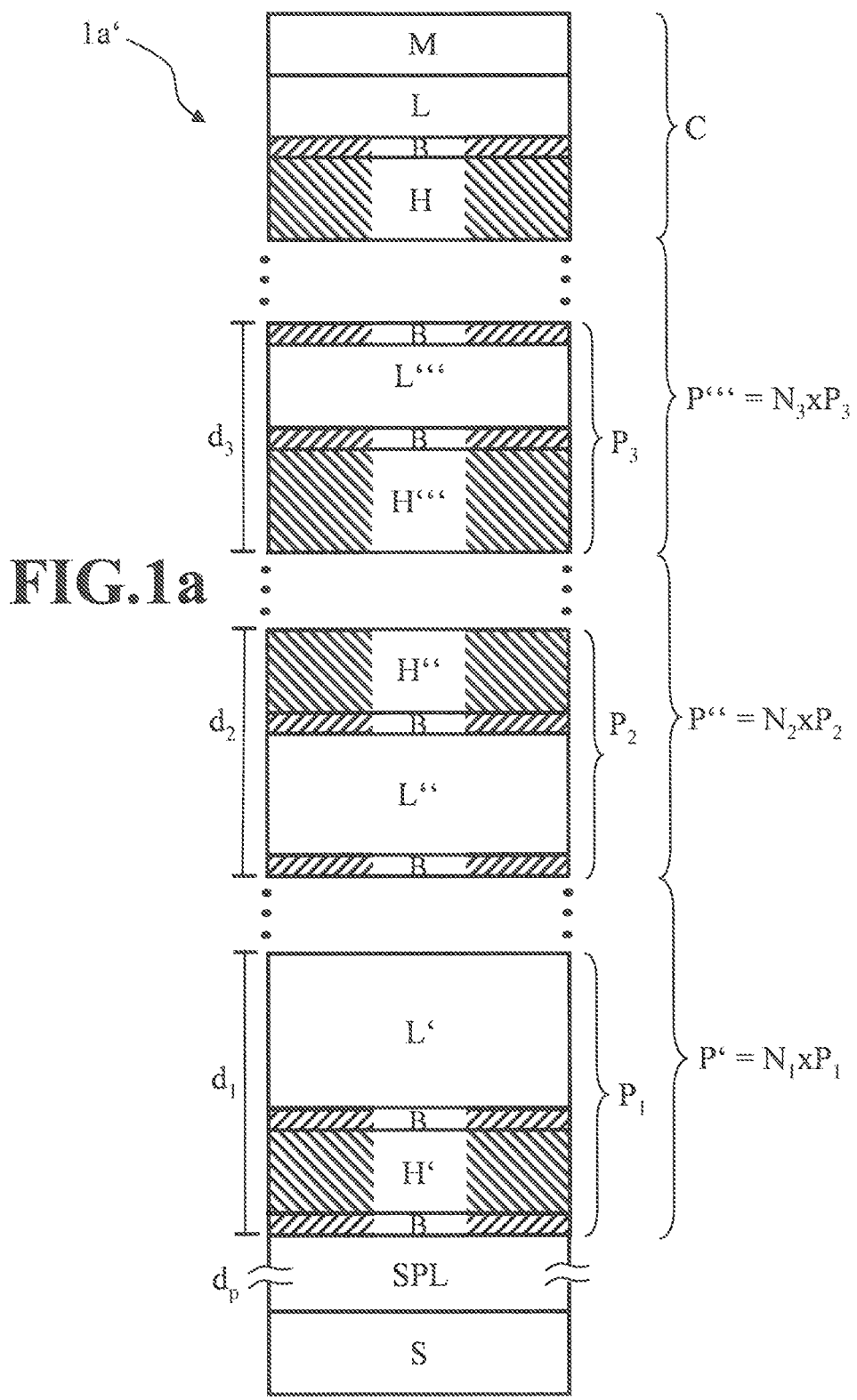
FIG. 1a shows a schematic illustration of the first mirror according to the invention with a surface protecting layer SPL.

FIG. 1a shows a mirror 1a' according to the invention, said mirror substantially corresponding to the mirror 1a according to the invention in FIG. 1. The difference between these mirrors is merely that, in the case of the mirror 1a', a surface protecting layer SPL having the thickness $d_p$ is situated between the upper three surface layer systems P', P" and P'" and the substrate S. Such a surface protecting layer SPL serves to protect the substrate from excessively high doses of EUV light since mirror substrates composed of e.g. Zerodur® or ULE® exhibit an irreversible densification of the order of magnitude of a few percent by volume at high doses of EUV light. In this case, a mirror surface protecting layer SPL composed of a metal such as e.g. nickel (Ni) having a thickness of approximately 50 to 100 nm has enough absorption, such that only very little EUV light penetrates as far as the underlying substrate S. The substrate is thereby sufficiently protected even at high doses of EUV light which occur during operation of a microlithography apparatus over many years. It is thus possible to prevent the situation where the optical imaging properties of a mirror no longer suffice for the operation of the microlithography apparatus after just a few months or years on account of the irreversible change in the surface of the substrate. A 100 nm to 5 μm thick amorphous layer like quartz or silicon above the surface protecting layer SPL could be used in the case of a material like nickel with a high surface roughness to reduce this roughness by polishing of the amorphous layer. Such an amorphous layer should be applied on the surface protecting layer SPL or on the substrate by a CVD method, in particular a PICVD, PACVD or PECVD method, since these coating methods mentioned lead to very compact layers which, even under EUV radiation, are stable and do not exhibit irreversible densification. The metal layers mentioned, such as e.g. nickel, are likewise stable under EUV radiation and do not exhibit irreversible densification.

The explanation as to why quartz layers, in contrast to the substrate material, are stable under high doses of EUV radiation even though the substrate materials are likewise based on the basic material quartz presumably resides in the process for producing the substrate materials, which takes place at high temperatures. As a result, presumably an intermediate thermodynamic state is frozen in the substrate material, this state undergoing transition to a thermodynamic ground state under high doses of EUV radiation, as a result of which the substrate material becomes more compact. Conversely, the quartz layers are applied at low temperatures using the methods mentioned, as a result of which presumably a thermodynamic ground state of the material is realized from the outset, and said state cannot be converted into a further ground state at a thermodynamically lower level as a result of high doses of EUV radiation.

As an alternative to a single surface protecting layer SPL, it is also possible to design a surface layer system P' of the mirror 1a from FIG. 1 in such a way that it affords sufficient protection for the underlying substrate on account of its absorption. For this purpose, the surface layer system should have a corresponding number of layers. In particular, a surface layer system P' having a number of periods that exceeds the number of periods of the surface layer systems P" and P'" of a layer arrangement for an EUV mirror is suitable for this purpose.

In this case, the reflectivity properties, the transmission properties and the stress properties of all the layers simultaneously have to be taken into account during each overall optimization of a layer arrangement.

Figure 2:
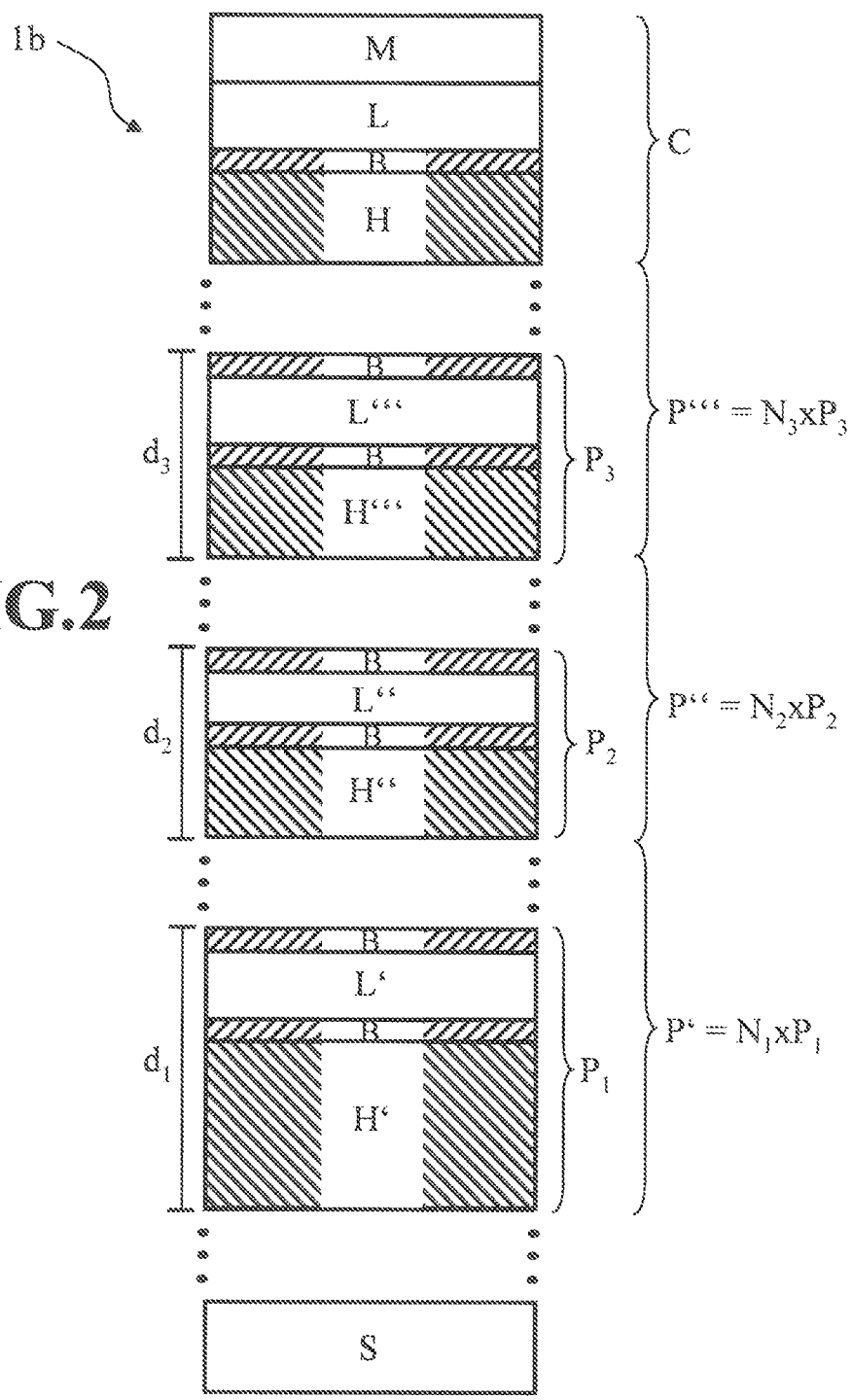
FIG. 2 shows a schematic illustration of a second mirror according to the invention.
Figure 2A:
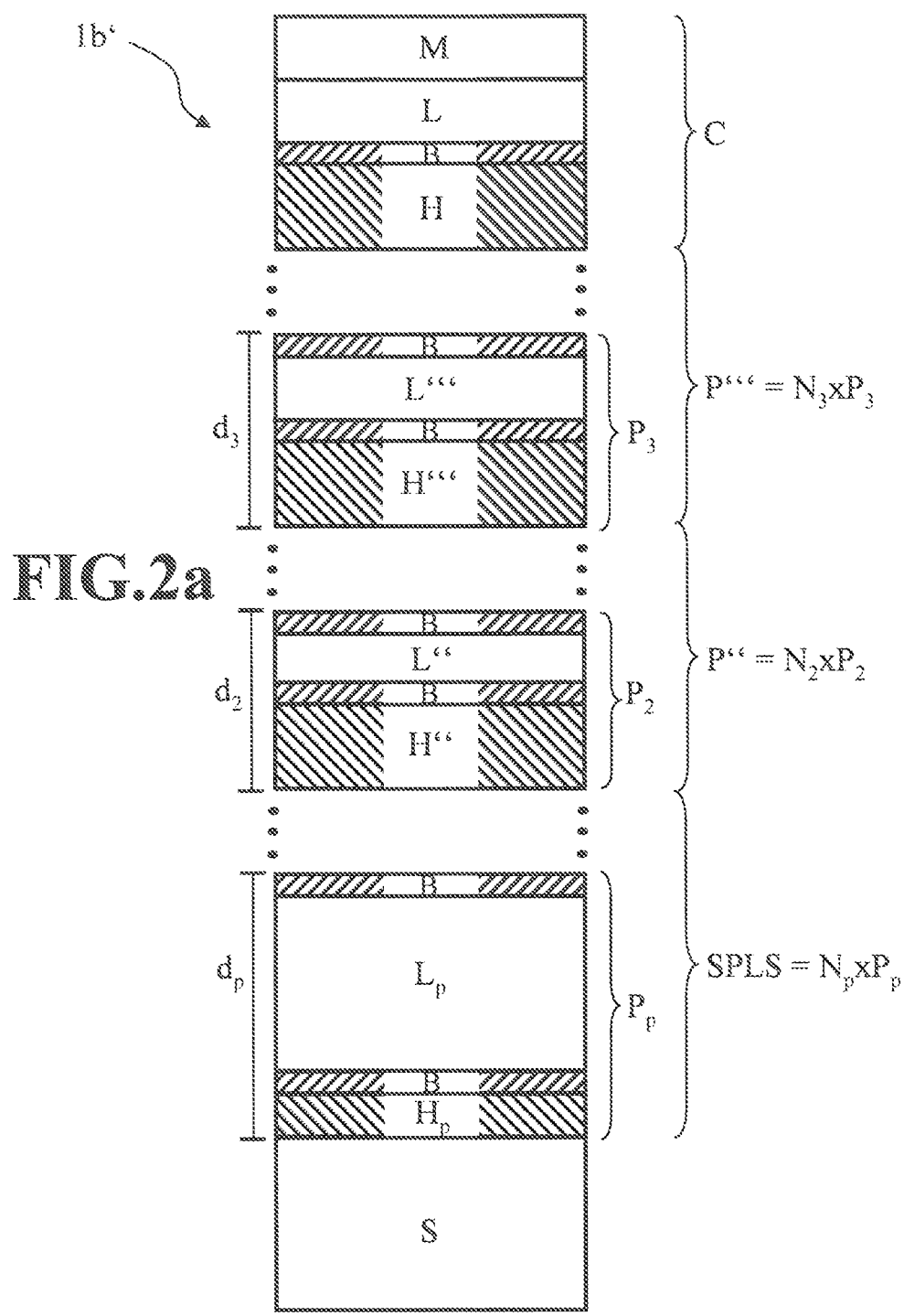
FIG. 2a shows a schematic illustration of the second mirror according to the invention with a surface protecting layer system SPLS.
Figure 3:
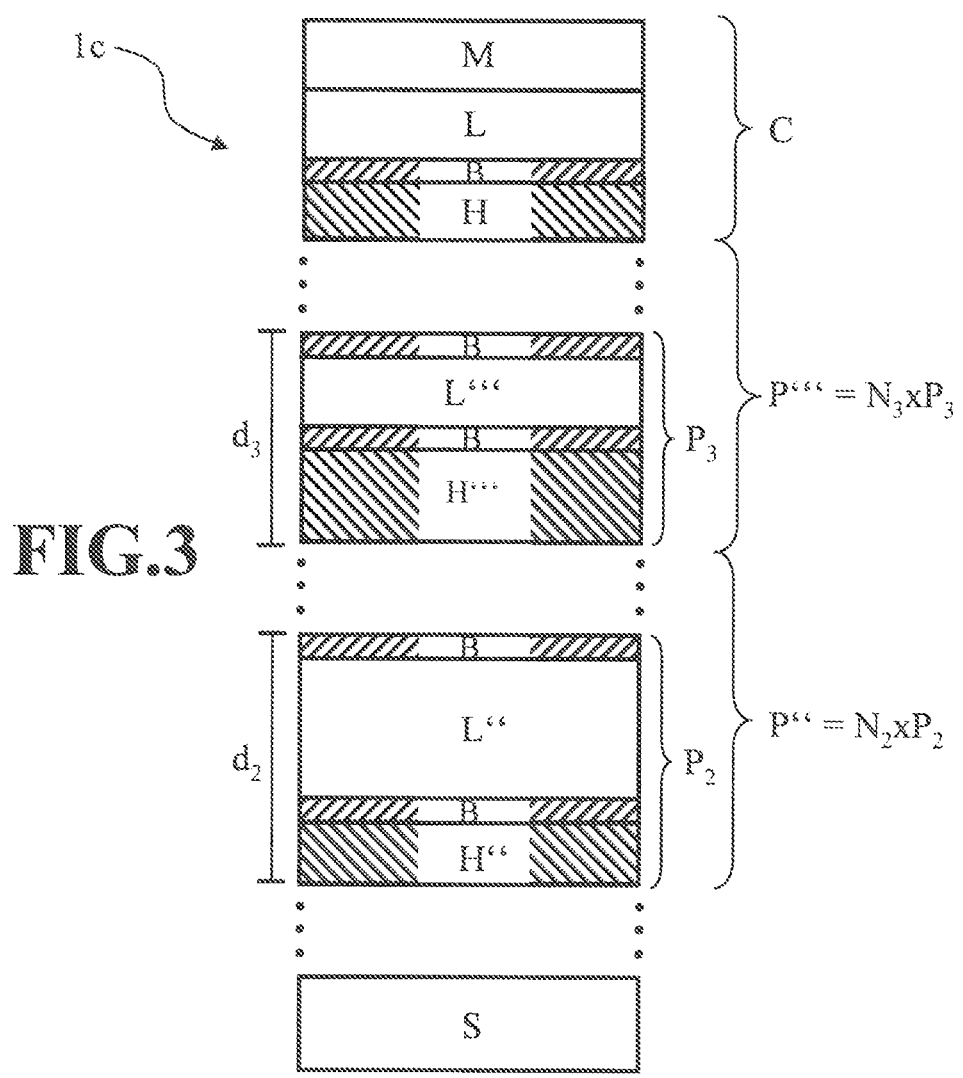
FIG. 3 shows a schematic illustration of a third mirror according to the invention.
Figure 3A:
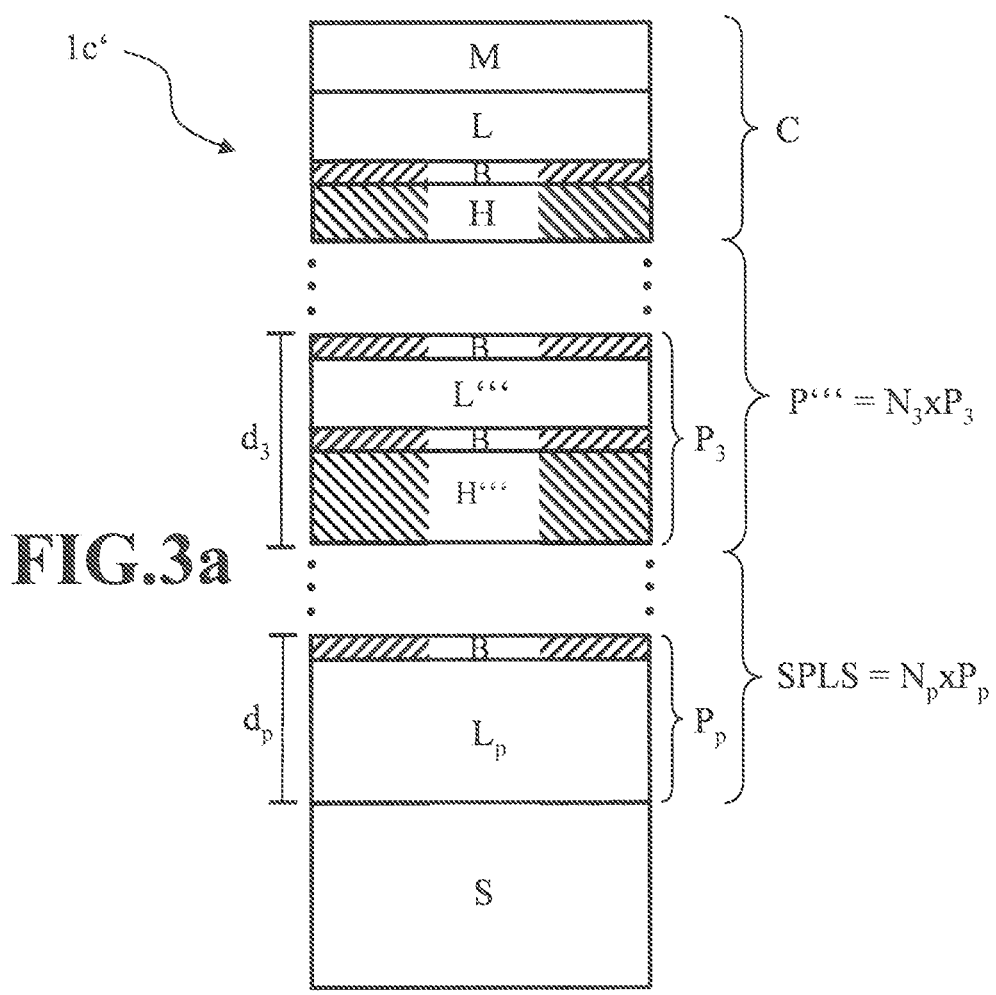
FIG. 3a shows a schematic illustration of the third mirror according to the invention with a surface protecting layer system SPLS.

Specific surface protecting layer systems SPLS as discussed below with reference to FIGS. 2a and 3a are likewise suitable for sufficiently protecting the substrate of the mirror 1a in FIG. 1 from EUV radiation.

FIG. 2 shows a schematic illustration of a mirror 1b according to the invention for the EUV wavelength range comprising a substrate S and a layer arrangement. In this case, the layer arrangement comprises a plurality of surface layer systems P', P" and P'" each consisting of a periodic sequence of at least two periods $P_1$, $P_2$ and $P_3$ of individual layers, wherein the periods $P_1$, $P_2$ and $P_3$ comprise two individual layers composed of different materials for a high refractive index layer H', H" and H'" and a low refractive index layer L', L" and L'" and have within each surface layer system P', P" and P'" a constant thickness $d_1$, $d_2$ and $d_3$ that deviates from a thickness of the periods of an adjacent surface layer system. In this case, the surface layer system P'" that is most distant from the substrate has a number $N_3$ of periods $P_3$ that is greater than the number $N_2$ of periods $P_2$ for the surface layer system P" that is second most distant from the substrate. In this case, unlike in the case of the exemplary embodiment concerning FIG. 1, the surface layer system P" that is second most distant from the substrate has a sequence of the periods $P_2$ which corresponds to the sequence of the periods $P_1$ and $P_3$ of the other surface layer systems P' and P'", such that the first high refractive index layer H'" of the surface layer system P'" that is most distant from the substrate optically actively succeeds the last low refractive index layer L" of the surface layer system P" that is second most distant from the substrate.

FIG. 2a shows a mirror 1b' according to the invention corresponding to the mirror 1b according to the invention in FIG. 2, the third surface layer system P' of which is designed as a surface protecting layer system SPLS. In this case, the surface protecting layer system SPLS comprises a plurality of periods of a high refractive index layer $H_p$, a low refractive index layer $L_p$ and two barrier layers B. In this case, the low refractive index layer consists of a metal, such as e.g. nickel or cobalt, and accordingly has a high absorption for EUV radiation, see Table 2a. In this case, the total thickness of the layers Lp of the surface protecting layer system SPLS corresponds approximately to the thickness of the surface protecting layer SPL in accordance with the mirror 1a' according to the invention from FIG. 1a. It goes without saying that a surface protecting layer SPL in accordance with the exemplary embodiment 1a' in FIG. 1a can be used between the layer arrangement of the mirror 1b and the substrate or as a replacement of the surface protecting layer system SPLS of the mirror 1b' in FIG. 2a.

The advantage of a surface protecting layer system SPLS over an individual surface protecting layer SPL is that possible crystal growth of the metal layers is prevented by the high refractive index layers. Such crystal growth leads to rough surfaces of the metal layers and this in turn leads to undesired stray light losses, as already mentioned in the introduction. Silicon as material of a high refractive index layer of a period is suitable for the metal nickel, whereas beryllium as high refractive index layer is suitable for the metal cobalt.

In order to prevent interdiffusion of these layers mentioned, it is possible to use barrier layers B such as are discussed in further association with other high and low refractive index layers in the context of this application.

FIG. 3 shows a schematic illustration of a further mirror 1c according to the invention for the EUV wavelength range comprising a substrate S and a layer arrangement. In this case, the layer arrangement comprises a plurality of surface layer systems P" and P'" each consisting of a periodic sequence of at least two periods $P_2$ and $P_3$ of individual layers, wherein the periods $P_2$ and $P_3$ comprise two individual layers composed of different materials for a high refractive index layer H" and H'" and a low refractive index layer L" and L'" and have within each surface layer system P" and P'" a constant thickness $d_2$ and $d_3$ that deviates from a thickness of the periods of an adjacent surface layer system. In this case, in a fourth exemplary embodiment in accordance with the description concerning FIGS. 14 and 15, the surface layer system P'" that is most distant from the substrate has a number $N_3$ of periods $P_3$ that is greater than the number $N_2$ of periods $P_2$ for the surface layer system P" that is second most distant from the substrate. This fourth exemplary embodiment also comprises, as a variant with respect to the illustration of the mirror 1c in FIG. 3 corresponding to mirror 1a, the reversed order of the layers in the surface layer system P" that is second most distant from the substrate S, such that this fourth exemplary embodiment also has the feature that the first high refractive index layer H'" of the surface layer system P'" that is most distant from the substrate optically actively succeeds the last low refractive index layer L" of the surface layer system P" that is second most distant from the substrate.

Particularly in the case of a small number of surface layer systems of, for example, just two surface layer systems, it is found that high reflectivity values are obtained if the period $P_3$ for the surface layer system P'" that is most distant from the substrate has a thickness of the high refractive index layer H'" which amounts to more than 120% of the thickness, in particular more than double the thickness, of the high refractive index layer H" of the period $P_2$ for the surface layer system P'" that is second most distant from the substrate.

FIG. 3a shows a schematic illustration of a further mirror 1c' according to the invention, said mirror differing from the mirror 1c in FIG. 3 in that the surface layer system P" that is situated closest to the substrate is embodied as a surface protecting layer system SPLS. In FIG. 3a, said surface protecting layer system SPLS merely consists of layers $L_p$ interrupted by barrier layers B. The barrier layers B serve, as already discussed above concerning FIG. 2a, to interrupt the crystal growth of the layers $L_p$. It goes without saying that the surface protecting layer system SPLS illustrated in FIG. 3a can be replaced by other surface protecting layers SPL or other surface protecting layer systems SPLS as discussed in association with FIG. 1a and FIG. 2a. In this case, the surface protecting layer system SPLS illustrated in FIG. 3a merely represents a simplified surface protecting layer system SPLS by comparison with the surface protecting layer system illustrated in FIG. 2a, in which the high refractive index layers $H_p$ have been dispensed with.

Consequently, the surface protecting layer system SPLS in FIG. 3a corresponding to the surface protecting layer SPL in FIG. 1a is restricted purely to the protection function for the substrate (S) by absorption and therefore has only little interaction with regard to the optical properties of the other surface layer systems. By contrast, the surface protecting layer system in FIG. 2a has a double function by virtue of the fact that, owing to its absorption properties, it provides for the protection of the substrate and by virtue of the fact that, owing to its reflection properties, it contributes to the reflection and thus to the optical performance of the mirror.

The transition in the designation of a layer system from a surface protecting layer system SPLS to a surface layer system P', P'' or P''' of the layer arrangement is fluid here since, as already discussed above in association with FIG. 1a, a surface layer system P' of the mirror 1a, given a corresponding design with a multiplicity of periods, also both contributes to the reflectivity effect of the mirror and undertakes a protective effect with respect to the substrate on account of the increased absorption of the multiplicity of periods. In contrast to the reflectivity, all of the layers of a layer arrangement have to be taken into account when considering the layer stresses of a layer design.

The surface layer systems of the layer arrangement of the mirrors according to the invention with respect to FIGS. 1, 2 and 3 succeed one another directly and are not separated by a further layer system. However, separation of the surface layer systems by an individual intermediate layer is conceivable for adapting the surface layer systems to one another or for optimizing the optical properties of the layer arrangement. This last does not apply, however, to the two surface layer systems P''' and P'''' of the first exemplary embodiment with respect to FIG. 1 and the fourth exemplary embodiment as a variant with respect to FIG. 3 since the desired optical effect would thereby be prevented by the reversal of the sequence of the layers in P'''.

The layers designated by H, $H_p$, H', H'' and H''' in FIGS. 1 to 3a are layers composed of materials which, in the EUV wavelength range, can be designated as high refractive index layers in comparison with the layers of the same surface layer system which are designated as L, $L_p$, L', L'' and L''', see the complex refractive indices of the materials in Table 2 and Table 2a. Conversely, the layers designated by L, $L_p$, L', L'' and L''' in FIGS. 1 to 3a are layers composed of materials which, in the EUV wavelength range, can be designated as low refractive index layers in comparison with the layers of the same surface layer system which are designated as H, $H_p$, H', H'' and H'''. Consequently, the terms high refractive index and low refractive index in the EUV wavelength range are relative terms with regard to the respective partner layer in a period of a surface layer system. Surface layer systems function in the EUV wavelength range generally only if a layer that acts optically with a high refractive index is combined with a layer that optically has a lower refractive index relative thereto, as main constituent of a period of the surface layer system. The material silicon is generally used for high refractive index layers. In combination with silicon, the materials molybdenum and ruthenium should be designated as low refractive index layers, see the complex refractive indices of the materials in Table 2.

In FIGS. 1 to 3a, a barrier layer B is in each case situated between the individual layers of a period, said barrier layer consisting of a material which is selected from or as a compound is composed of the group of materials: $B_4C$, C, Si nitride, Si carbide, Si boride, Mo nitride, Mo carbide, Mo boride, Ru nitride, Ru carbide and Ru boride. Such a barrier layer suppresses the interdiffusion between the two individual layers of a period, thereby increasing the optical contrast in the transition of the two individual layers. With the use of the materials molybdenum and silicon for the two individual layers of a period, one barrier layer above the silicon layer, as viewed from the substrate, suffices in order to provide for a sufficient contrast. The second barrier layer above the molybdenum layer can be dispensed with in this case. In this respect, at least one barrier layer for separating the two individual layers of a period should be provided, wherein the at least one barrier layer may perfectly well be constructed from various ones of the above-indicated materials or the compounds thereof and may in this case also exhibit a layered construction of different materials or compounds.

Barrier layers which comprise the material $B_4C$ and have a thickness of between 0.35 nm and 0.8 nm, preferably between 0.4 nm and 0.6 nm, lead in practice to high reflectivity values of the layer arrangement. Particularly in the case of surface layer systems composed of ruthenium and silicon, barrier layers composed of $B_4C$ exhibit a maximum of reflectivity in the case of values of between 0.4 nm and 0.6 nm for the thickness of the barrier layer.

In the case of the mirrors 1a, 1a', 1b, 1b', 1c and 1c' according to the invention, the number $N_p$, $N_1$, $N_2$ and $N_3$ of periods $P_p$, $P_1$, $P_2$ and $P_3$ of the surface layer systems SPLS, P', P'' and P''' can comprise in each case up to 100 periods of the individual periods $P_p$, $P_1$, $P_2$ and $P_3$ illustrated in FIGS. 1 to 3a. Furthermore, between the layer arrangements illustrated in FIGS. 1 to 3a and the substrate S, an additional intermediate layer or an additional intermediate layer arrangement can be provided, which serves for the stress compensation of the layer arrangement with respect to the substrate.

The same materials in the same sequence as for the layer arrangement itself can be used as materials for the additional intermediate layer or the additional intermediate layer arrangement for stress compensation. In the case of the intermediate layer arrangement, however, it is possible to dispense with the barrier layer between the individual layers since the intermediate layer or the intermediate layer arrangement generally makes a negligible contribution to the reflectivity of the mirror and so the issue of an increase in contrast by the barrier layer is unimportant in this case. Multilayer arrangements composed of alternating chromium and scandium layers or amorphous molybdenum or ruthenium layers would likewise be conceivable as the additional intermediate layer or intermediate layer arrangement for stress compensation. The latter can likewise be chosen in terms of their thickness, e.g. greater than 20 nm, such that an underlying substrate is sufficiently protected from EUV radiation. In this case, the additional intermediate layer or the additional intermediate layer arrangement would likewise act as a surface protecting layer SPL or as a surface protecting layer system SPLS, respectively, and protect the substrate from EUV radiation.

The layer arrangements of the mirrors 1a, 1a', 1b, 1b', 1c and 1c' according to the invention are terminated in FIGS. 1 to 3a by a covering layer system C comprising at least one layer composed of a chemically inert material such as e.g. Rh, Pt, Ru, Pd, Au, $SiO_2$ etc. as a terminating layer M. Said terminating layer M thus prevents the chemical alteration of the mirror surface on account of ambient influences. The covering layer system C in FIGS. 1 to 3a consists, besides the terminating layer M, of a high refractive index layer H, a low refractive index layer L and a barrier layer B.

The thickness of one of the periods $P_p$, $P_1$, $P_2$ and $P_3$ results from FIGS. 1 to 3a as the sum of the thicknesses of the individual layers of the corresponding period, that is to say from the thickness of the high refractive index layer, the thickness of the low refractive index layer and the thickness of two barrier layers. Consequently, the surface layer systems SPLS, P', P'' and P''' in FIGS. 1 to 3a, given the same choice of material, can be distinguished from one another by virtue of the fact that their periods $P_p$, $P_1$, $P_2$ and $P_3$ have a different thickness $d_1$, $d_2$ and $d_3$. Consequently, in the context of the present invention, different surface layer systems SPLS, P', P'' and P''' given the same choice of material are understood to be surface layer systems whose periods $P_p$, $P_1$, $P_2$ and $P_3$ differ by more than 0.1 nm in their thicknesses $d_1$, $d_2$ and $d_3$, since a different optical effect of the surface layer systems can no longer be assumed below a difference of 0.1 nm given otherwise identical division of the periods between high and low refractive index layers. Furthermore, inherently identical surface layer systems can fluctuate by this absolute value in their period thicknesses during their production on different production apparatuses. For the case of a surface layer system SPLS, P', P" and P"' having a period composed of molybdenum and silicon, it is also possible, as already described above, to dispense with the second barrier layer within the period $P_p$, $P_1$, $P_2$ and $P_3$, such that in this case the thickness of the periods $P_p$, $P_1$, $P_2$ and $P_3$ results from the thickness of the high refractive index layer, the thickness of the low refractive index layer and the thickness of a barrier layer.

Figure 4:
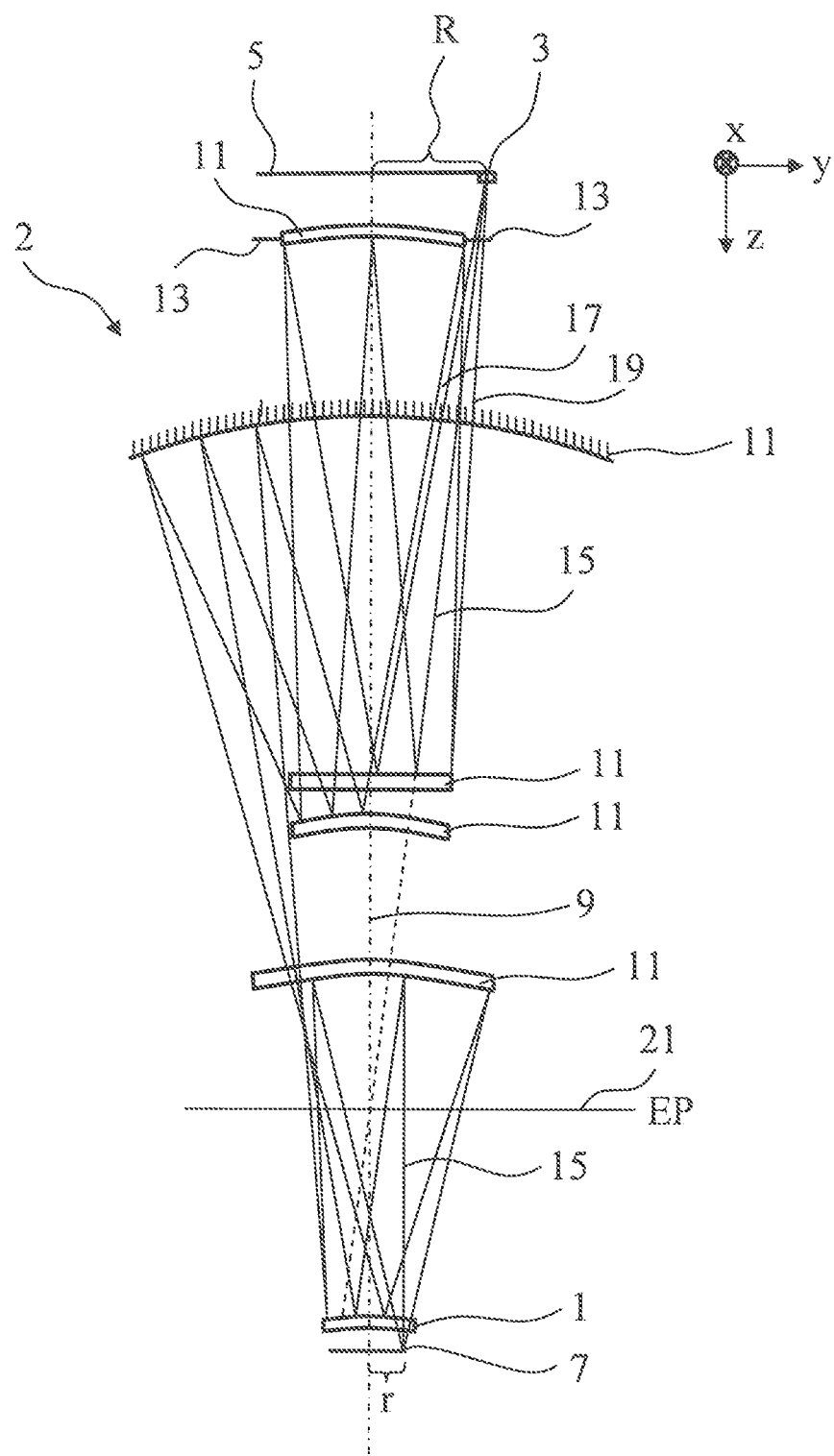
FIG. 4 shows a schematic illustration of a projection objective according to the invention for a projection exposure apparatus for microlithography.

FIG. 4 shows a schematic illustration of a projection objective 2 according to the invention for a projection exposure apparatus for microlithography having six mirrors 1, 11, including at least one mirror 1 configured on the basis of the mirrors 1a, 1a', 1b, 1b', 1c and 1c' according to the invention in accordance with the exemplary embodiments with respect to FIGS. 8 to 15. The task of a projection exposure apparatus for microlithography is to image the structures of a mask, which is also referred to as a reticle, lithographically onto a so-called wafer in an image plane. For this purpose, a projection objective 2 according to the invention in FIG. 4 images an object field 3, which is arranged in the object plane 5, into an image field in the image plane 7. The structure-bearing mask, which is not illustrated in the drawing for the sake of clarity, can be arranged at the location of the object field 3 in the object plane 5. For orientation purposes, FIG. 4 illustrates a system of Cartesian coordinates, the x-axis of which points into the plane of the figure. In this case, the x-y coordinate plane coincides with the object plane 5, the z-axis being perpendicular to the object plane 5 and pointing downward. The projection objective has an optical axis 9, which does not run through the object field 3. The mirrors 1, 11 of the projection objective 2 have a design surface that is rotationally symmetrical with respect to the optical axis. In this case, said design surface must not be confused with the physical surface of a finished mirror, since the latter surface is trimmed relative to the design surface in order to ensure passages of light past the mirror. In this exemplary embodiment, the aperture stop 13 is arranged on the second mirror 11 in the light path from the object plane 5 to the image plane 7. The effect of the projection objective 2 is illustrated with the aid of three rays, the principal ray 15 and the two aperture marginal rays 17 and 19, all of which originate in the center of the object field 3. The principal ray 15, which runs at an angle of 6° with respect to the perpendicular to the object plane, intersects the optical axis 9 in the plane of the aperture stop 13. As viewed from the object plane 5, the principal ray 15 appears to intersect the optical axis in the entrance pupil plane 21. This is indicated in FIG. 4 by the dashed extension of the principal ray 15 through the first mirror 11. Consequently, the virtual image of the aperture stop 13, the entrance pupil, lies in the entrance pupil plane 21. The exit pupil of the projection objective could likewise be found with the same construction in the backward extension of the principal ray 15 proceeding from the image plane 7. However, in the image plane 7 the principal ray 15 is parallel to the optical axis 9, and from this it follows that the backward projection of these two rays produces a point of intersection at infinity in front of the projection objective 2 and the exit pupil of the projection objective 2 is thus at infinity. Therefore, this projection objective 2 is a so-called objective that is telecentric on the image side. The center of the object field 3 is at a distance R from the optical axis 9 and the center of the image field 7 is at a distance r from the optical axis 9, in order that no undesirable vignetting of the radiation emerging from the object field occurs in the case of the reflective configuration of the projection objective.

Figure 5:
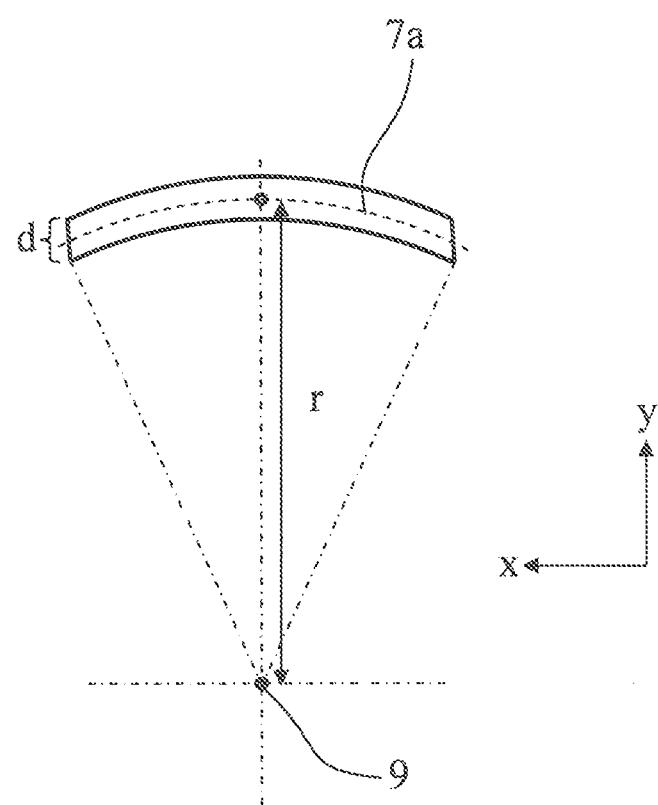
FIG. 5 shows a schematic illustration of the image field of the projection objective.

FIG. 5 shows a plan view of an arcuate image field 7a such as occurs in the projection objective 2 illustrated in FIG. 4, and a system of Cartesian coordinates, the axes of which correspond to those from FIG. 4. The image field 7a is a sector from an annulus, the center of which is given by the point of intersection of the optical axis 9 with the object plane. The average radius r is 34 mm in the case illustrated. The width of the field in the y-direction d is 2 mm here. The central field point of the image field 7a is marked as a small circle within the image field 7a. As an alternative, a curved image field can also be delimited by two circle arcs which have the same radius and are displaced relative to one another in the y-direction. If the projection exposure apparatus is operated as a scanner, then the scanning direction runs in the direction of the shorter extent of the object field, that is to say in the direction of the y-direction.

Figure 6:
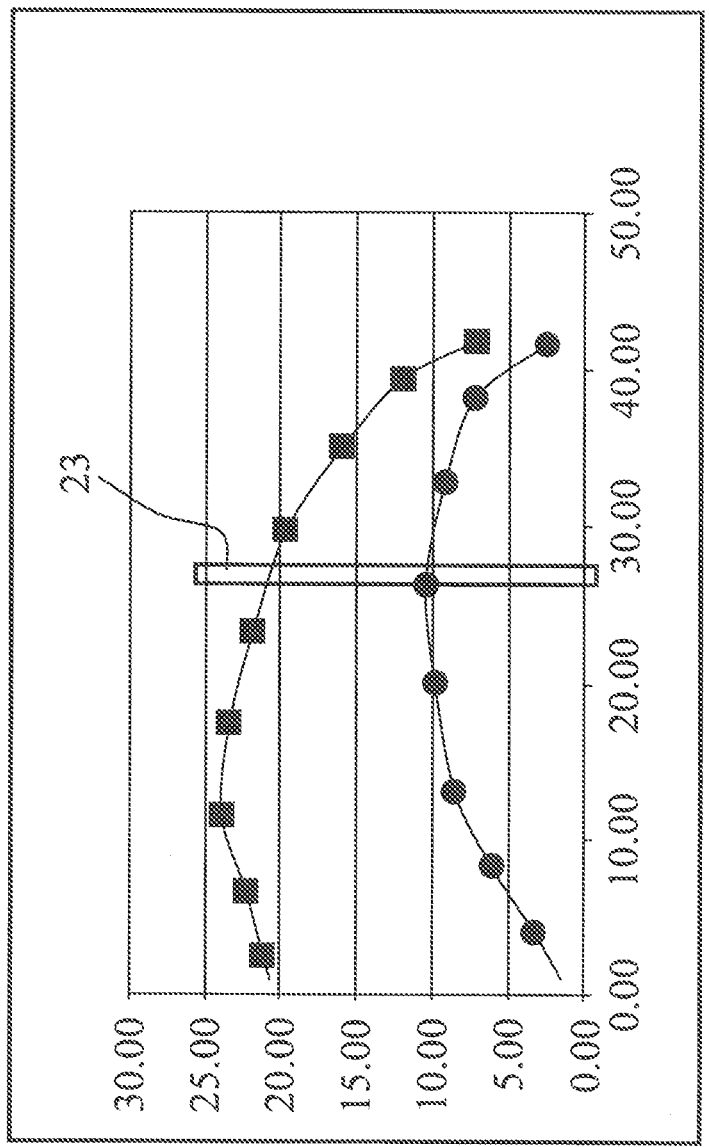
FIG. 6 shows an exemplary illustration of the maximum angles of incidence and the interval lengths of the angle of incidence intervals against the distance of the locations of a mirror according to the invention with respect to the optical axis within a projection objective.

FIG. 6 shows an exemplary illustration of the maximum angles of incidence (rectangles) and of the interval lengths of the angle of incidence intervals (circles) in the unit degrees [°] against different radii or distances between the locations of the mirror surface and the optical axis, indicated in the unit [mm], of the penultimate mirror 1 in the light path from the object plane 5 to the image plane 7 of the projection objective 2 from FIG. 4. Said mirror 1, in the case of a projection objective 2 for microlithography which has six mirrors 1, 11 for the EUV wavelength range, is generally that mirror which has to ensure the largest angles of incidence and the largest angle of incidence intervals or the greatest variation of angles of incidence. In the context of this application, the interval length of an angle of incidence interval as a measure of the variation of angles of incidence is understood to be the number of angular degrees of that angular range in degrees between the maximum and minimum angles of incidence which the coating of the mirror has to ensure for a given distance from the optical axis on account of the requirements of the optical design. The angle of incidence interval will also be abbreviated to AOI interval.

The optical data of the projection objective in accordance with Table 1 are applicable in the case of the mirror 1 on which FIG. 6 is based. In this case, the aspheres of the mirrors 1, 11 of the optical design are specified as rotationally symmetrical surfaces using the perpendicular distance Z(h) of an asphere point relative to the tangential plane in the asphere vertex as a function of the perpendicular distance h of the asphere point with respect to the normal in the asphere vertex in accordance with the following asphere equation:

$$Z(h) = (rho*h^2)/\left(1 + [1-(1+k_y)*(rho*h)^2]^{0.5}\right) + + c_1*h^4 + c_2*h^6 + c_3*h^8 + c_4*h^{10} + c_5*h^{12} + c_6*h^{14}$$

with the radius R=1/rho of the mirror and the parameters $k_y$, $c_1$, $c_2$, $c_3$, $c_4$, $c_5$, and $c_6$ in the unit [mm]. In this case, said parameters $c_n$ are normalized with regard to the unit [mm] in accordance with [1/mm$^{2n+2}$] in such a way as to result in the asphere Z(h) as a function of the distance h also in the unit [mm].

TABLE 1

Data of the optical design regarding the angles of incidence of the mirror 1 in FIG. 6 in accordance with the schematic illustration of the design on the basis of FIG. 4.

| Designation of the surface in accordance with FIG. 2 | Radius R in [mm] | Distance from the nearest surface in [mm] | Asphere parameters with the unit $[1/mm^{2n+2}]$ for $c_n$ |
|---|---|---|---|
| Object plane 5 | infinity | 697.657821079643 | |
| 1st mirror 11 | −3060.189398512395 | 494.429629463009 | |
| | | | $k_y = 0.00000000000000E+00$ |
| | | | $c_1 = 8.46747658600840E−10$ |
| | | | $c_2 = −6.38829035308911E−15$ |
| | | | $c_3 = 2.99297298249148E−20$ |
| | | | $c_4 = 4.89923345704506E−25$ |
| | | | $c_5 = −2.62811636654902E−29$ |
| | | | $c_6 = 4.29534493103729E−34$ |
| 2nd mirror 11 --diaphragm-- | −1237.831140064837 | 716.403660000000 | |
| | | | $k_y = 3.05349335818189E+00$ |
| | | | $c_1 = 3.01069673080653E−10$ |
| | | | $c_2 = 3.09241275151742E−16$ |
| | | | $c_3 = 2.71009214786939E−20$ |
| | | | $c_4 = −5.04344434347305E−24$ |
| | | | $c_5 = 4.22176379615477E−28$ |
| | | | $c_6 = −1.41314914233702E−32$ |
| 3rd mirror 11 | 318.277985359899 | 218.770165786534 | |
| | | | $k_y = −7.80082610035452E−01$ |
| | | | $c_1 = 3.12944645776932E−10$ |
| | | | $c_2 = −1.32434614339199E−14$ |
| | | | $c_3 = 9.56932396033676E−19$ |
| | | | $c_4 = −3.13223523243916E−23$ |
| | | | $c_5 = 4.73030659773901E−28$ |
| | | | $c_6 = −2.70237216494288E−33$ |
| 4th mirror 11 | −513.327287349838 | 892.674538915941 | |
| | | | $k_y = −1.05007411819774E−01$ |
| | | | $c_1 = −1.33355977877878E−12$ |
| | | | $c_2 = −1.71866358951357E−16$ |
| | | | $c_3 = 6.69985430179187E−22$ |
| | | | $c_4 = 5.40777151247246E−27$ |
| | | | $c_5 = −1.16662974927332E−31$ |
| | | | $c_6 = 4.19572235940121E−37$ |
| Mirror 1 | 378.800274177878 | 285.840721874570 | |
| | | | $k_y = 0.00000000000000E+00$ |
| | | | $c_1 = 9.27754883183223E−09$ |
| | | | $c_2 = 5.96362556484499E−13$ |
| | | | $c_3 = 1.56339572303953E−17$ |
| | | | $c_4 = −1.41168321383233E−21$ |
| | | | $c_5 = 5.98677250336455E−25$ |
| | | | $c_6 = −6.30124060830317E−29$ |
| 5th mirror 11 | −367.938526548613 | 325.746354374172 | |
| | | | $k_y = 1.07407597789597E−01$ |
| | | | $c_1 = 3.87917960004046E−11$ |
| | | | $c_2 = −3.43420257078373E−17$ |
| | | | $c_3 = 2.26996395088275E−21$ |
| | | | $c_4 = −2.71360350994977E−25$ |
| | | | $c_5 = 9.23791176750829E−30$ |
| | | | $c_6 = −1.37746833100643E−34$ |
| Image plane 7 | infinity | | |

It can be discerned from FIG. 6 that maximum angles of incidence of 24° and interval lengths of 11° occur at different locations of the mirror 1. Consequently, the layer arrangement of the mirror 1 has to yield high and uniform reflectivity values at these different locations for different angles of incidence and different angle of incidence intervals, since otherwise a high total transmission and an acceptable pupil apodization of the projection objective 2 cannot be ensured.

The so-called PV value is used as a measure of the variation of the reflectivity of a mirror over the angles of incidence. In this case, the PV value is defined as the difference between the maximum reflectivity $R_{max}$ and the minimum reflectivity $R_{min}$ in the angle of incidence interval under consideration divided by the average reflectivity $R_{average}$ in the angle of incidence interval under consideration. Consequently, $PV=(R_{max}−R_{min})/R_{average}$ holds true.

In this case, it should be taken into consideration that high PV values for a mirror 1 of the projection objective 2 as penultimate mirror before the image plane 7 in accordance with FIG. 4 and the design in Table 1 lead to high values for the pupil apodization. In this case, there is a correlation between the PV value of the mirror 1 and the imaging aberration of the pupil apodization of the projection objective 2 for high PV values of greater than 0.25 since, starting from this value, the PV value dominates the pupil apodization relative to other causes of aberration.

In FIG. 6, a bar 23 is used to mark by way of example a specific radius or a specific distance of the locations of the mirror 1 having the associated maximum angle of incidence of approximately 21° and the associated interval length of 11° with respect to the optical axis. Said marked radius corresponds in FIG. 7, described below, to the locations on the circle 23a—illustrated in dashed fashion—within the hatched region 20, which represents the optically used region 20 of the mirror 1.

Figure 7:
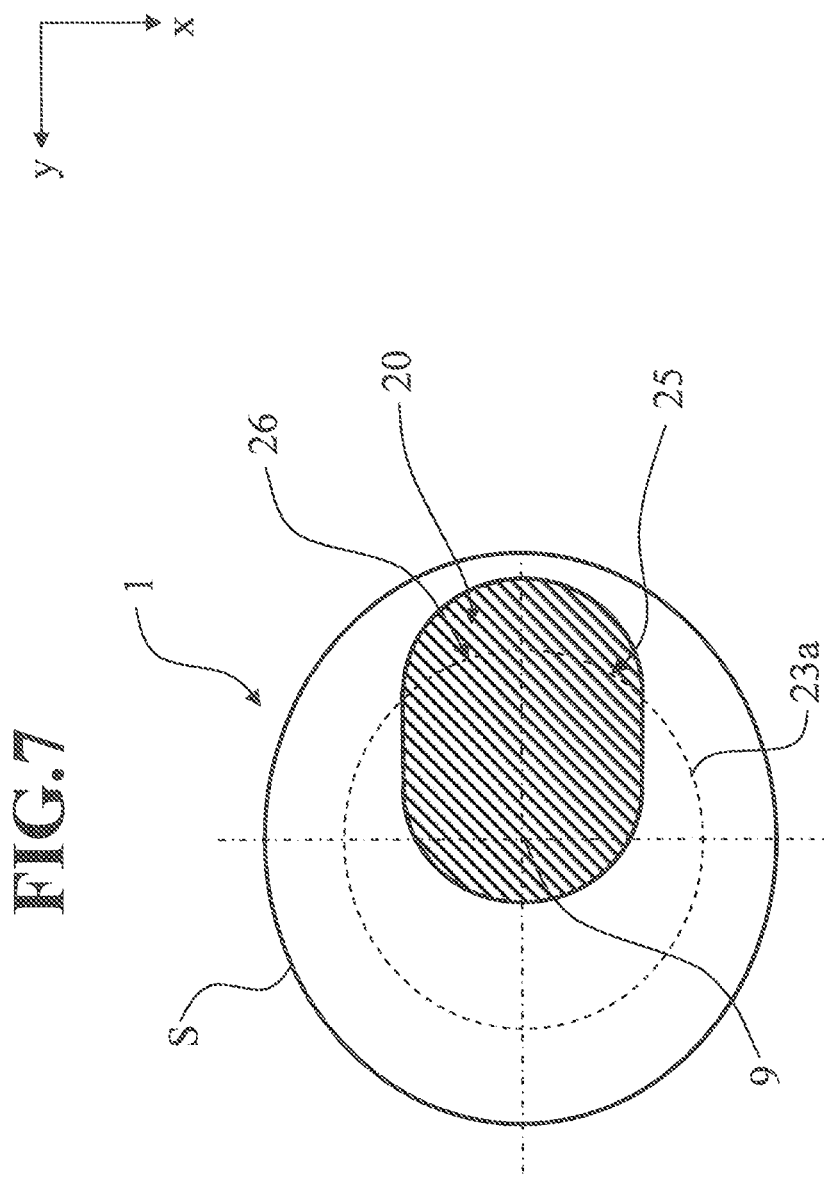
FIG. 7 shows a schematic illustration of the optically utilized region on the substrate of a mirror according to the invention.

FIG. 7 shows the substrate S of the penultimate mirror 1 in the light path from the object plane 5 to the image plane 7 of the projection objective 2 from FIG. 4 as a circle centered with respect to the optical axis 9 in plan view. In this case, the optical axis 9 of the projection objective 2 corresponds to the axis 9 of symmetry of the substrate. Furthermore, in FIG. 7, the optically used region 20 of the mirror 1, said region being offset with respect to the optical axis, is depicted in hatched fashion and a circle 23a is depicted in dashed fashion.

In this case, the part of the dashed circle 23a within the optically used region corresponds to the locations of the mirror 1 which are identified by the depicted bar 23 in FIG. 6. Consequently, the layer arrangement of the mirror 1 along the partial region of the dashed circle 23a within the optically used region 20, in accordance with the data from FIG. 6, has to ensure high reflectivity values both for a maximum angle of incidence of 21° and for a minimum angle of incidence of approximately 10°. In this case, the minimum angle of incidence of approximately 10° results from the maximum angle of incidence of 21° from FIG. 6 on account of the interval length of 11°. The locations on the dashed circle at which the two abovementioned extreme values of the angles of incidence occur are emphasized in FIG. 7 by the tip of the arrow 26 for the angle of incidence of 10° and by the tip of the arrow 25 for the angle of incidence of 21°.

Since a layer arrangement cannot be varied locally over the locations of a substrate S without high technological outlay and layer arrangements are generally applied rotationally symmetrically with respect to the axis 9 of symmetry of the substrate, the layer arrangement along the locations of the dashed circle 23a in FIG. 7 comprises one and the same layer arrangement such as is shown in its basic construction in FIGS. 1 to 3a and is explained in the form of specific exemplary embodiments with reference to FIGS. 8 to 15. In this case, it should be taken into consideration that a rotationally symmetrical coating of the substrate S with respect to the axis 9 of symmetry of the substrate S with the layer arrangement has the effect that the periodic sequence of the surface layer systems SPLS, P', P'' and P''' of the layer arrangement is maintained at all locations of the mirror and only the thickness of the periods of the layer arrangement depending on the distance from the axis 9 of symmetry acquires a rotationally symmetrical profile over the substrate S, the layer arrangement being thinner at the edge of the substrate S than in the center of the substrate S at the axis 9 of symmetry.

It should be taken into consideration that it is possible, through a suitable coating technology, for example by the use of distribution diaphragms, to adapt the rotationally symmetrical radial profile of the thickness of a coating over the substrate. Consequently, in addition to the design of the coating per se, with the radial profile of the so-called thickness factor of the coating design over the substrate, a further degree of freedom is available for optimizing the coating design.

The reflectivity values illustrated in FIGS. 8 to 15 were calculated using the complex refractive indices ñ=n−i*k indicated in Table 2 for the used materials at the wavelength of 13.5 nm. In this case, it should be taken into consideration that reflectivity values of real mirrors can turn out to be lower than the theoretical reflectivity values illustrated in FIGS. 8 to 15, since in particular the refractive indices of real thin layers can deviate from the literature values mentioned in Table 2.

The refractive indices employed for the materials of the surface protecting layer SPL, $L_p$ and the surface protecting layer system SPLS are indicated in Table 2a.

TABLE 2

Employed refractive indices ñ = n − i * k for 13.5 nm

| Material | Chemical symbol | Layer design symbol | n | k |
|---|---|---|---|---|
| Substrate | | | 0.973713 | 0.0129764 |
| Silicon | Si | H, H', H'', H''' | 0.999362 | 0.00171609 |
| Boron carbide | B$_4$C | B | 0.963773 | 0.0051462 |
| Molybdenum | Mo | L, L', L'', L''' | 0.921252 | 0.0064143 |
| Ruthenium | Ru | M, L, L', L'', L''' | 0.889034 | 0.0171107 |
| Vacuum | | | 1 | 0 |

TABLE 2a

Employed refractive indices ñ = n − i * k for 13.5 nm for materials for the surface protecting layer SPL and the surface protecting layer system SPLS

| Material | Chemical symbol | Layer design symbol | n | k |
|---|---|---|---|---|
| Nickel | Ni | SPL, $L_p$ | 0.9483 | 0.0727 |
| Cobalt | Co | SPL, $L_p$ | 0.9335 | 0.0660 |
| Silicon | Si | $H_p$ | 0.9994 | 0.0017 |
| Beryllium | Be | $H_p$ | 0.9888 | 0.0018 |
| Boron carbide | B$_4$C | B | 0.9638 | 0.0051 |
| Carbon | C | B | 0.9617 | 0.0069 |

Moreover, the following short notation in accordance with the layer sequence with respect to FIGS. 1, 2 and 3 is declared for the layer designs associated with FIGS. 8 to 15:

Substrate/ . . . /(P$_1$)*N$_1$/(P$_2$)*N$_2$/(P$_3$)*N$_3$/covering layer system C where

P1=H'BL'B; P2=H''BL''B; P3=H'''BL'''B; C=HBLM;

for FIGS. 2 and 3 and where

P1=BH'BL'; P2=BL''BH''; P3=H'''BL'''B; C=HBLM;

for FIG. 1 and for the fourth exemplary embodiment as a variant with respect to FIG. 3.

In this case, the letters H symbolically represent the thickness of high refractive index layers, the letters L represent the thickness of low refractive index layers, the letter B represents the thickness of the barrier layer and the letter M represents the thickness of the chemically inert terminating layer in accordance with Table 2 and the description concerning FIGS. 1, 2 and 3.

In this case, the unit [nm] applies to the thicknesses of the individual layers that are specified between the parentheses. The layer design used with respect to FIGS. 8 and 9 can thus be specified as follows in the short notation:

Substrate/ . . . /(0.4B$_4$C2.921Si0.4B$_4$C4.931Mo)*8/
(0.4B$_4$C4.145Mo0.4B$_4$C2.911 Si)*5/
(3.509Si0.4B$_4$C3.216Mo0.4B$_4$C)*16/
2.975Si0.4B$_4$C2Mo1.5Ru Since the barrier layer B$_4$C in this example is always 0.4 nm thick, it can also be omitted for illustrating the basic construction of the layer arrangement, such that the layer design with respect to FIGS. 8 and 9 can be specified in a manner shortened as follows:

Substrate/ . . . /(2.921Si4.931Mo)*8/(4.145Mo2.911Si)*5/(3.509Si3.216Mo)*16/2.975Si2Mo1.5Ru It should be recognized from this first exemplary embodiment according to FIG. 1 that the order of the high refractive index layer Si and the low refractive index layer Mo in the second surface layer system, comprising five periods, has been reversed relative to the other surface layer systems, such that the first high refractive index layer of the surface layer system that is most distant from the substrate, with a thickness of 3.509 nm, directly succeeds the last high refractive index layer of the surface layer system that is second most distant from the substrate, with a thickness of 2.911 nm.

Figure 10:
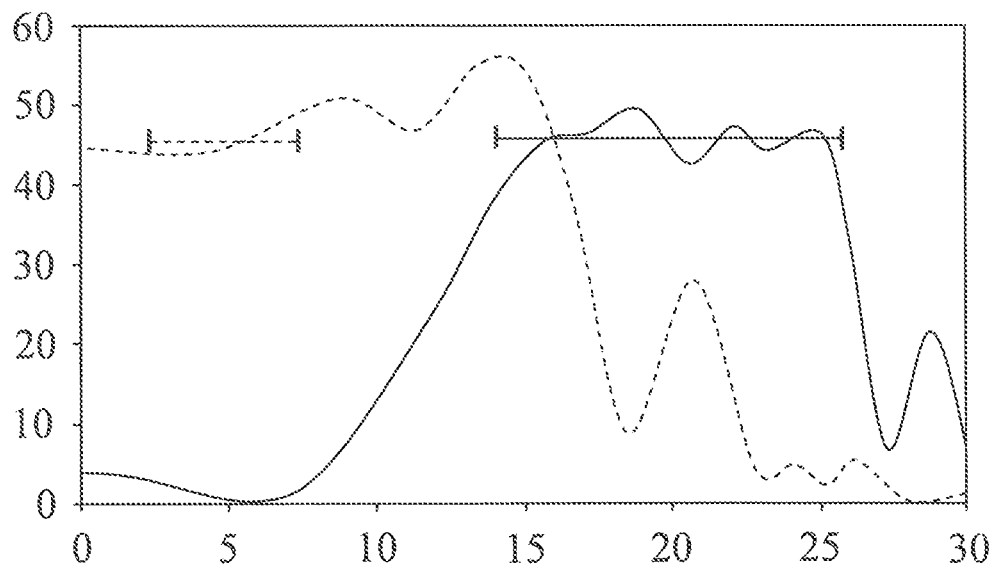
FIG. 10 shows a schematic illustration of some reflectivity values against the angles of incidence of the second mirror according to the invention from FIG. 2.
Figure 11:
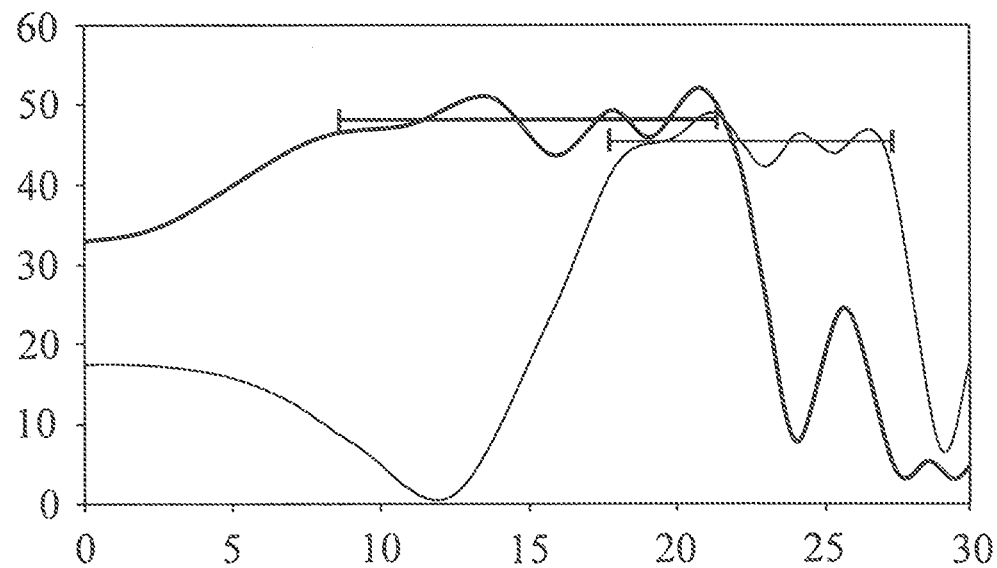
FIG. 11 shows a schematic illustration of further reflectivity values against the angles of incidence of the second mirror according to the invention from FIG. 2.
Figure 12:
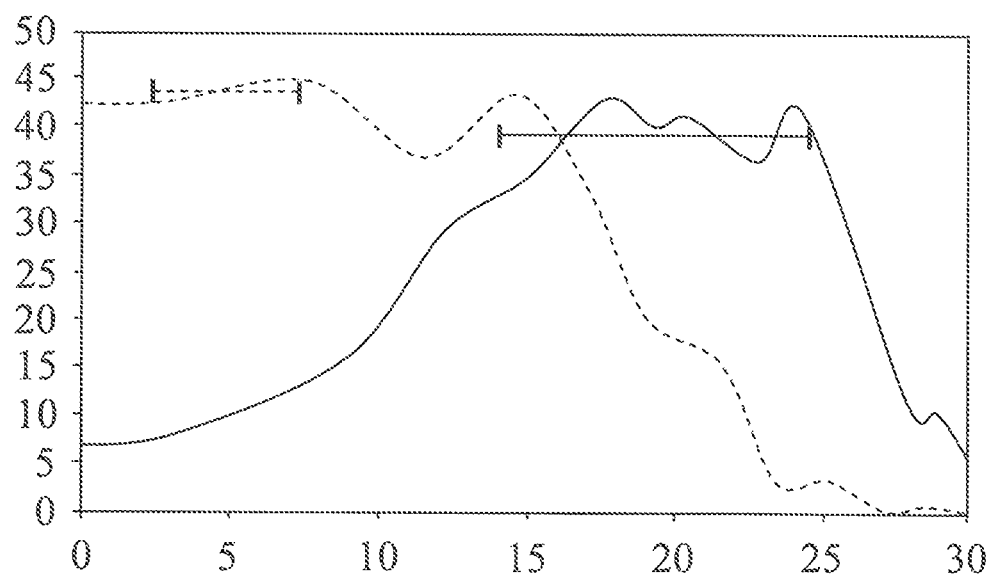
FIG. 12 shows a schematic illustration of some reflectivity values against the angles of incidence of the third mirror according to the invention from FIG. 3.
Figure 13:
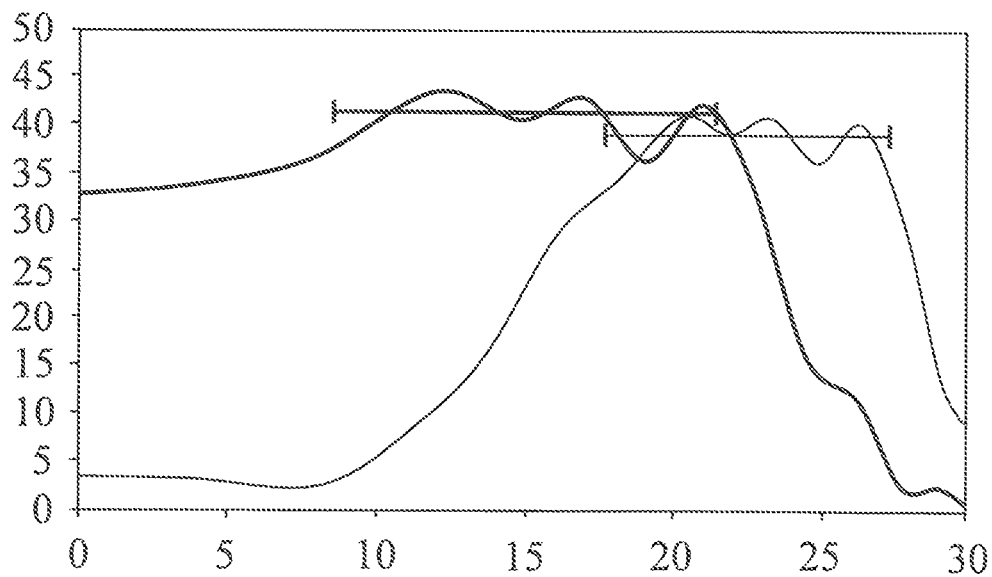
FIG. 13 shows a schematic illustration of further reflectivity values against the angles of incidence of the third mirror according to the invention from FIG. 3.

Correspondingly, it is possible to specify the layer design used with respect to FIGS. 10 and 11 as second exemplary embodiment in accordance with FIG. 2 in the short notation as:

Substrate/ . . . /(4.737Si0.4B$_4$C2.342Mo0.4B$_4$C)*28/(3.443Si0.4B$_4$C2.153Mo0.4B$_4$C)*5/(3.523Si0.4B$_4$C3.193Mo0.4B$_4$C)*15/2.918Si0.4B$_4$C2Mo1.5Ru Since the barrier layer B$_4$C in this example is in turn always 0.4 nm thick, it can also be omitted for illustrating this layer arrangement, such that the layer design with respect to FIGS. 10 and 11 can be specified in a manner shortened as follows:

Substrate/ . . . /(4.737Si2.342Mo)*28/(3.443Si2.153Mo)*5/(3.523Si3.193Mo)*15/2.918Si2Mo1.5Ru Accordingly, it is possible to specify the layer design used with respect to FIGS. 12 and 13 as third exemplary embodiment in accordance with FIG. 3 in the short notation as:

Substrate/ . . . /(1.678Si0.4B$_4$C5.665Mo0.4B$_4$C)*27/(3.798Si0.4B$_4$C2.855Mo0.4B$_4$C)*14/1.499Si0.4B$_4$C2Mo1.5Ru and, disregarding the barrier layer B$_4$C for illustration purposes, as:

Substrate/ . . . /(1.678Si5.665Mo)*27/(3.798Si2.855Mo)*14/1.499Si2Mo1.5Ru

Figure 14:
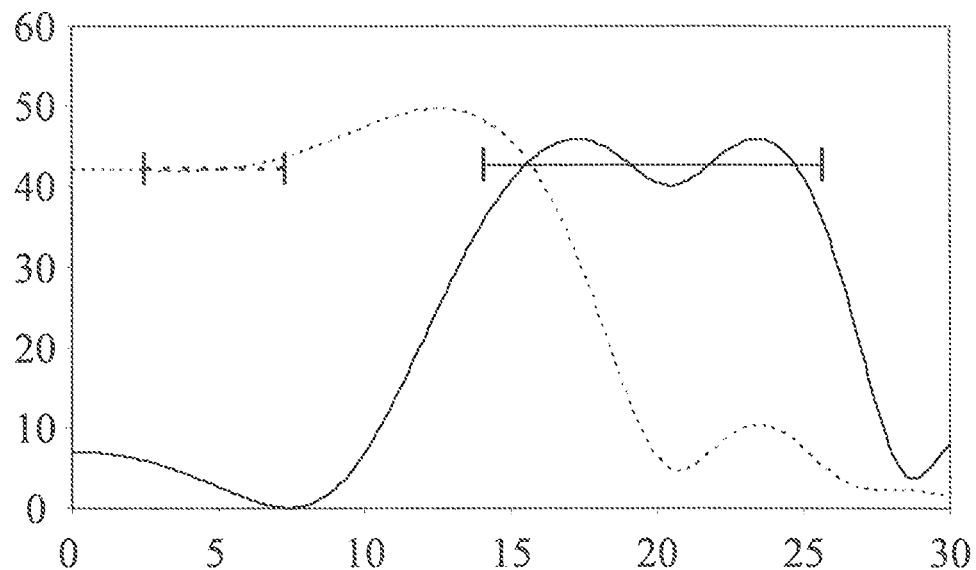
FIG. 14 shows a schematic illustration of some reflectivity values against the angles of incidence of a fourth mirror according to the invention.
Figure 15:
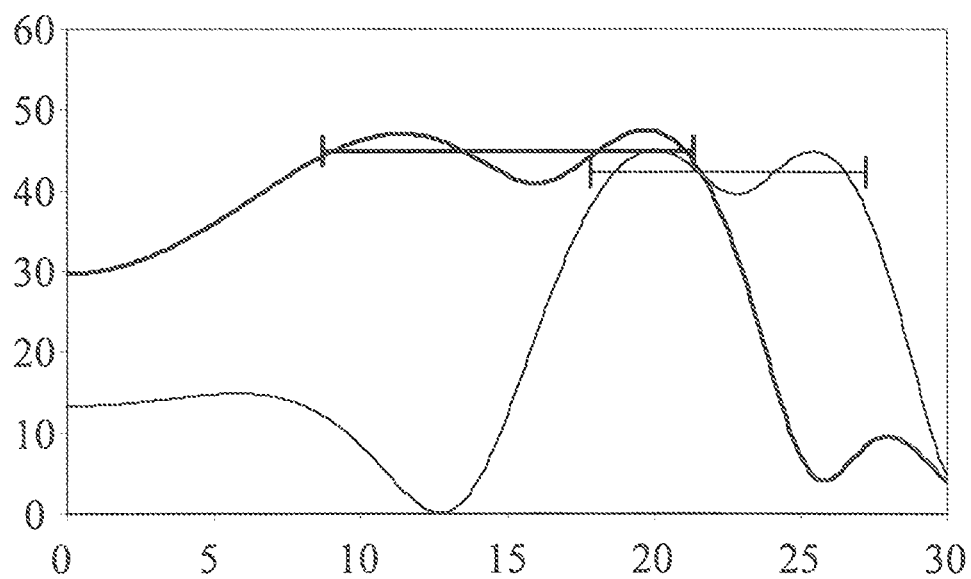
FIG. 15 shows a schematic illustration of further reflectivity values against the angles of incidence of the fourth mirror according to the invention.

Likewise, it is possible to specify the layer design used with respect to FIGS. 14 and 15 as fourth exemplary embodiment in accordance with a variant with respect to FIG. 3 in the short notation as:

Substrate/ . . . /(0.4B$_4$C4.132Mo0.4B$_4$C2.78Si)*6/(3.608Si0.4B$_4$C3.142Mo0.4B$_4$C)*16/2.027Si0.4B$_4$C2Mo1.5Ru and, disregarding the barrier layer B$_4$C for illustration purposes, as:

Substrate/ . . . /(4.132Mo2.78Si)*6/(3.609Si3.142Mo)*16/2.027Si2Mo1.5Ru

It should be recognized from this fourth exemplary embodiment that the order of the high refractive index layer Si and the low refractive index layer Mo in the surface layer system P''', comprising six periods, has been reversed relative to the other surface layer system P'''' having 16 periods, such that the first high refractive index layer of the surface layer system P'''' that is most distant from the substrate, with a thickness of 3.609 nm, directly succeeds the last high refractive index layer of the surface layer system P''' that is second most distant from the substrate, with a thickness of 2.78 nm.

This fourth exemplary embodiment is therefore a variant of the third exemplary embodiment in which the order of the high and low refractive index layers in the surface layer system P''' that is second most distant from the substrate has been reversed according to the first exemplary embodiment with respect to FIG. 1.

It goes without saying that the layer designs specified above can also be provided with a 2 μm thick quartz layer as a polishing layer in the case of a substrate or a surface protection layer SPL having a high surface roughness:

Substrate/2000SiO$_2$/(0.4B$_4$C2.921Si0.4B$_4$C4.931Mo)*8/(0.4B$_4$C4.145Mo0.4B$_4$C 2.911Si)*5/(3.509Si0.4B$_4$C3.216Mo0.4B$_4$C)*16/2.975Si0.4B$_4$C2Mo1.5Ru Correspondingly, it is possible to specify this layer design with a 100 nm thick nickel layer as surface protecting layer SPL in accordance with FIG. 1a as:

Substrate/100 Ni/(0.4B$_4$C2.921Si0.4B$_4$C4.931Mo)*8/(0.4B$_4$C4.145Mo0.4B$_4$C 2.911Si)*5/(3.509Si0.4B$_4$C3.216Mo0.4B$_4$C)*16/2.975Si0.4B$_4$C2Mo1.5Ru As an alternative, it is possible to specify this layer design with a surface protecting layer system SPLS consisting of 20 periods of 5 nm thick nickel and 3 nm thick carbon layers in accordance with FIG. 3a as:

Substrate/(5 Ni3 C)*20/(0.4B$_4$C2.921Si0.4B$_4$C4.931Mo)*8/(0.4B$_4$C4.145Mo0.4B$_4$C2.911Si)*5/(3.509Si0.4B$_4$C3.216Mo0.4B$_4$C)*16/2.975Si0.4B$_4$C2Mo1.5Ru It should be taken into consideration that individual surface protecting layers SPL composed of nickel have only a small influence on the reflectivity curves of the layer designs with respect to FIGS. 8 to 15. The alteration of the reflectivity values is approximately 1% in this case.

By contrast, a surface protecting layer system SPLS composed of 20 periods of 5 nm thick nickel and 3 nm thick carbon layers has the effect that the reflectivity curves of the layer designs with respect to FIGS. 8 to 15 shift by approximately an angle of incidence of 2°, such that a subsequent optimization of the layer design becomes necessary in this case given a fixedly predetermined angle of incidence interval. After such an optimization has been carried out, the alteration of the reflectivity values of these layer designs with the surface protecting layer system SPLS by comparison with the layer designs with respect to FIGS. 8 to 15 is approximately 2%.

Figure 8:
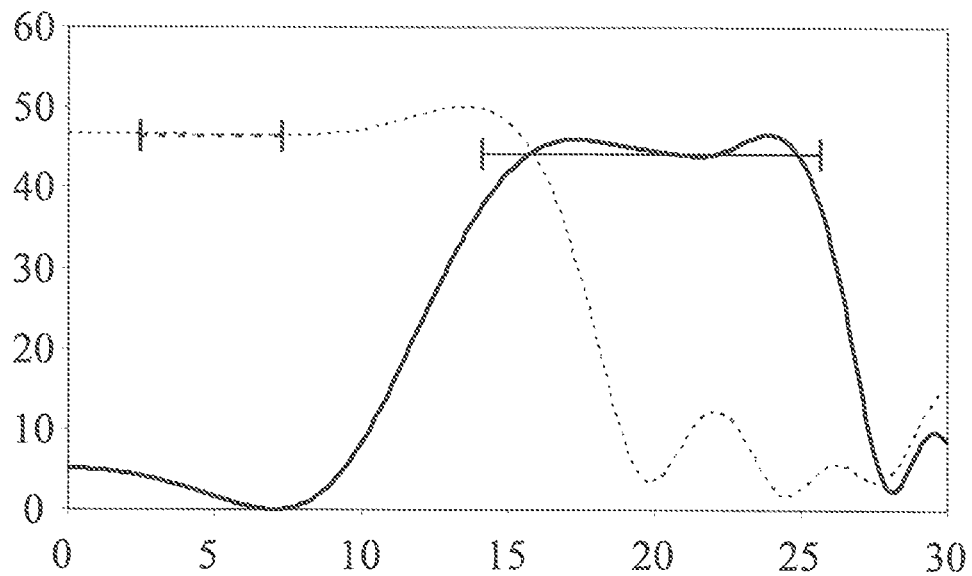
FIG. 8 shows a schematic illustration of some reflectivity values against the angles of incidence of the first mirror according to the invention from FIG. 1.

FIG. 8 shows reflectivity values for unpolarized radiation in the unit [%] of the first exemplary embodiment of a mirror 1a according to the invention in accordance with FIG. 1 plotted against the angle of incidence in the unit [°]. In this case, the first surface layer system P' of the layer arrangement of the mirror 1a consists of $N_1$=8 periods $P_1$, wherein the period $P_1$ consists of 2.921 nm Si as high refractive index layer and 4.931 nm Mo as low refractive index layer, and also of two barrier layers each comprising 0.4 nm B$_4$C. The period $P_1$ consequently has a thickness $d_1$ of 8.652 nm. The second surface layer system P'' of the layer arrangement of the mirror 1a having the reversed order of the layers Mo and Si consists of $N_2$=5 periods $P_2$, wherein the period $P_2$ consists of 2.911 nm Si as high refractive index layer and 4.145 nm Mo as low refractive index layer, and also of two barrier layers each comprising 0.4 nm B$_4$C. The period $P_2$ consequently has a thickness $d_2$ of 7.856 nm. The third surface layer system P''' of the layer arrangement of the mirror 1a consists of $N_3$=16 periods $P_3$, wherein the period $P_3$ consists of 3.509 nm Si as high refractive index layer and 3.216 nm Mo as low refractive index layer, and also of two barrier layers each comprising 0.4 nm B$_4$C. The period $P_3$ consequently has a thickness $d_3$ of 7.525 nm. The layer arrangement of the mirror 1a is terminated by a covering layer system C consisting of 2.975 nm Si, 0.4 nm B$_4$C, 2 nm Mo and 1.5 nm Ru in the order specified. Consequently, the surface layer system P''' that is most distant from the substrate has a number $N_3$ of periods $P_3$ that is greater than the number $N_2$ of periods $P_2$ for the surface layer system P'' that is second most distant from the substrate and the first high refractive index layer H''' of the surface layer system P''' that is most distant from the substrate directly succeeds the last high refractive index layer H'' of the surface layer system P'' that is second most distant from the substrate.

The reflectivity values of this nominal layer design with the thickness factor 1 in the unit [%] at a wavelength of 13.5 nm are illustrated as a solid line against the angle of incidence in the unit [°] in FIG. 8. Moreover, the average reflectivity of this nominal layer design for the angle of incidence interval of 14.1° to 25.7° is depicted as a solid horizontal bar. Furthermore, FIG. 8 correspondingly specifies, at a wavelength of 13.5 nm and given a thickness factor of 0.933, as a dashed line the reflectivity values against the angles of incidence and as a dashed bar the average reflectivity of the above-specified layer design for the angle of incidence interval of 2.5° to 7.3°. Consequently, the thicknesses of the periods of the layer arrangement with respect to the reflectivity values illustrated as a dashed line in FIG. 8 amount to only 93.3% of the corresponding thicknesses of the periods of the nominal layer design. In other words, the layer arrangement is thinner than the nominal layer design by 6.7% at the mirror surface of the mirror 1a at the locations at which angles of incidence of between 2.5° and 7.3° have to be ensured.

Figure 9:
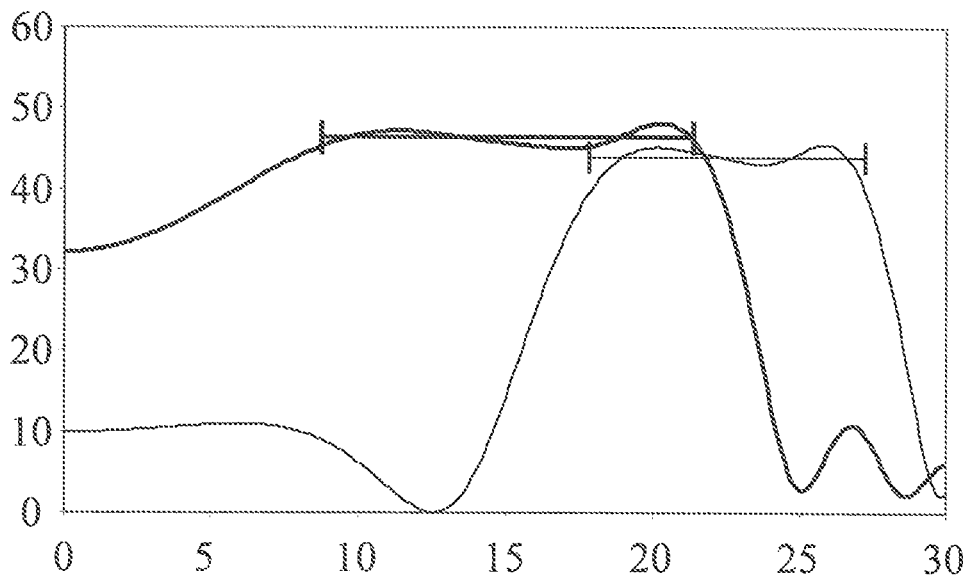
FIG. 9 shows a schematic illustration of further reflectivity values against the angles of incidence of the first mirror according to the invention from FIG. 1.

FIG. 9 shows, at a wavelength of 13.5 nm and given a thickness factor of 1.018, in a manner corresponding to FIG. 8, as a thin line the reflectivity values against the angles of incidence and as a thin bar the average reflectivity of the above-specified layer design for the angle of incidence interval of 17.8° to 27.2°, and also, given a thickness factor of 0.972, in a corresponding manner, as a thick line the reflectivity values against the angles of incidence and as a thick bar the average reflectivity of the above-specified layer design for the angle of incidence interval of 8.7° to 21.4°. Consequently, the layer arrangement is thicker than the nominal layer design by 1.8% at the mirror surface of the mirror 1a at the locations at which angles of incidence of between 17.8° and 27.2° have to be ensured and is correspondingly thinner than the nominal layer design by 2.8% at the locations at which angles of incidence of between 8.7° and 21.4° have to be ensured.

The average reflectivity and PV values which can be achieved by the layer arrangement with respect to FIG. 8 and FIG. 9 are compiled relative to the angle of incidence intervals and the thickness factors in Table 3. It can be discerned that the mirror 1a comprising the layer arrangement specified above, at a wavelength of 13.5 nm for angles of incidence of between 2.5° and 27.2°, has an average reflectivity of more than 43% and a variation of the reflectivity as PV value of less than or equal to 0.21.

TABLE 3

Average reflectivity and PV values of the layer design with respect to FIG. 8 and FIG. 9 relative to the angle of incidence interval in degrees and the thickness factor chosen.

| AOI Interval [°] | Thickness factor | R_average [%] | PV |
|---|---|---|---|
| 17.8-27.2 | 1.018 | 43.9 | 0.14 |
| 14.1-25.7 | 1 | 44.3 | 0.21 |
| 8.7-21.4 | 0.972 | 46.4 | 0.07 |
| 2.5-7.3 | 0.933 | 46.5 | 0.01 |

FIG. 10 shows reflectivity values for unpolarized radiation in the unit [%] of the second exemplary embodiment of a mirror 1b according to the invention in accordance with FIG. 2 plotted against the angle of incidence in the unit [°]. In this case, the first surface layer system P' of the layer arrangement of the mirror 1b consists of $N_1=28$ periods $P_1$, wherein the period $P_1$ consists of 4.737 nm Si as high refractive index layer and 2.342 nm Mo as low refractive index layer, and also of two barrier layers each comprising 0.4 nm $B_4C$. The period $P_1$ consequently has a thickness $d_1$ of 7.879 nm. The second surface layer system P'' of the layer arrangement of the mirror 1b consists of $N_2=5$ periods $P_2$, wherein the period $P_2$ consists of 3.443 nm Si as high refractive index layer and 2.153 nm Mo as low refractive index layer, and also of two barrier layers each comprising 0.4 nm $B_4C$. The period $P_2$ consequently has a thickness $d_2$ of 6.396 nm. The third surface layer system P''' of the layer arrangement of the mirror 1b consists of $N_3=15$ periods $P_3$, wherein the period $P_3$ consists of 3.523 nm Si as high refractive index layer and 3.193 nm Mo as low refractive index layer, and also of two barrier layers each comprising 0.4 nm $B_4C$. The period $P_3$ consequently has a thickness $d_3$ of 7.516 nm. The layer arrangement of the mirror 1b is terminated by a covering layer system C consisting of 2.918 nm Si, 0.4 nm $B_4C$, 2 nm Mo and 1.5 nm Ru in the order specified. Consequently, the surface layer system P''' that is most distant from the substrate has a number $N_3$ of periods $P_3$ that is greater than the number $N_2$ of periods $P_2$ for the surface layer system P'' that is second most distant from the substrate.

The reflectivity values of this nominal layer design with the thickness factor 1 in the unit [%] at a wavelength of 13.5 nm are illustrated as a solid line against the angle of incidence in the unit [°] in FIG. 10. Moreover, the average reflectivity of this nominal layer design for the angle of incidence interval of 14.1° to 25.7° is depicted as a solid horizontal bar. Furthermore, FIG. 10 correspondingly specifies, at a wavelength of 13.5 nm and given a thickness factor of 0.933, as a dashed line the reflectivity values against the angles of incidence and as a dashed bar the average reflectivity of the above-specified layer design for the angle of incidence interval of 2.5° to 7.3°. Consequently, the thicknesses of the periods of the layer arrangement with respect to the reflectivity values illustrated as a dashed line in FIG. 10 amount to only 93.3% of the corresponding thicknesses of the periods of the nominal layer design. In other words, the layer arrangement is thinner than the nominal layer design by 6.7% at the mirror surface of the mirror 1b at the locations at which angles of incidence of between 2.5° and 7.3° have to be ensured.

FIG. 11 shows, at a wavelength of 13.5 nm and given a thickness factor of 1.018, in a manner corresponding to FIG. 10, as a thin line the reflectivity values against the angles of incidence and as a thin bar the average reflectivity of the above-specified layer design for the angle of incidence interval of 17.8° to 27.2°, and also, given a thickness factor of 0.972, in a corresponding manner, as a thick line the reflectivity values against the angles of incidence and as a thick bar the average reflectivity of the above-specified layer design for the angle of incidence interval of 8.7° to 21.4°. Consequently, the layer arrangement is thicker than the nominal layer design by 1.8% at the mirror surface of the mirror 1b at the locations at which angles of incidence of between 17.8° and 27.2° have to be ensured and is correspondingly thinner than the nominal layer design by 2.8% at the locations at which angles of incidence of between 8.7° and 21.4° have to be ensured.

The average reflectivity and PV values which can be achieved by the layer arrangement with respect to FIG. 10 and FIG. 11 are compiled relative to the angle of incidence intervals and the thickness factors in Table 4. It can be discerned that the mirror 1b comprising the layer arrangement specified above, at a wavelength of 13.5 nm for angles of incidence of between 2.5° and 27.2°, has an average reflectivity of more than 45% and a variation of the reflectivity as PV value of less than or equal to 0.23.

TABLE 4

Average reflectivity and PV values of the layer design with respect to FIG. 10 and FIG. 11 relative to the angle of incidence interval in degrees and the thickness factor chosen.

| AOI Interval [°] | Thickness factor | R_average [%] | PV |
| --- | --- | --- | --- |
| 17.8-27.2 | 1.018 | 45.2 | 0.17 |
| 14.1-25.7 | 1 | 45.7 | 0.23 |
| 8.7-21.4 | 0.972 | 47.8 | 0.18 |
| 2.5-7.3 | 0.933 | 45.5 | 0.11 |

FIG. 12 shows reflectivity values for unpolarized radiation in the unit [%] of the third exemplary embodiment of a mirror 1c according to the invention in accordance with FIG. 3 plotted against the angle of incidence in the unit [°]. In this case, the surface layer system P″ of the layer arrangement of the mirror 1c consists of $N_2$=27 periods $P_2$, wherein the period $P_2$ consists of 1.678 nm Si as high refractive index layer and 5.665 nm Mo as low refractive index layer, and also of two barrier layers each comprising 0.4 nm $B_4C$. The period $P_2$ consequently has a thickness $d_2$ of 8.143 nm. The surface layer system P‴ of the layer arrangement of the mirror 1c consists of $N_3$=14 periods $P_3$, wherein the period $P_3$ consists of 3.798 nm Si as high refractive index layer and 2.855 nm Mo as low refractive index layer, and also of two barrier layers each comprising 0.4 nm $B_4C$. Consequently, the period $P_3$ has a thickness $d_3$ of 7.453 nm. The layer arrangement of the mirror 1c is terminated by a covering layer system C consisting of 1.499 nm Si, 0.4 nm $B_4C$, 2 nm Mo and 1.5 nm Ru in the order specified. Consequently, the surface layer system P‴ that is most distant from the substrate has a thickness of the high refractive index layer H‴ that amounts to more than double the thickness of the high refractive index layer H″ of the surface layer system P″ that is second most distant from the substrate.

The reflectivity values of this nominal layer design with the thickness factor 1 in the unit [%] at a wavelength of 13.5 nm are illustrated as a solid line against the angle of incidence in the unit [°] in FIG. 12. Moreover, the average reflectivity of this nominal layer design for the angle of incidence interval of 14.1° to 25.7° is depicted as a solid horizontal bar. Furthermore, FIG. 12 correspondingly specifies, at a wavelength of 13.5 nm and given a thickness factor of 0.933, as a dashed line the reflectivity values against the angles of incidence and as a dashed bar the average reflectivity of the above-specified layer design for the angle of incidence interval of 2.5° to 7.3°. Consequently, the thicknesses of the periods of the layer arrangement with respect to the reflectivity values illustrated as a dashed line in FIG. 12 amount to only 93.3% of the corresponding thicknesses of the periods of the nominal layer design. In other words, the layer arrangement is thinner than the nominal layer design by 6.7% at the mirror surface of the mirror 1c at the locations at which angles of incidence of between 2.5° and 7.3° have to be ensured.

FIG. 13 shows in a manner corresponding to FIG. 12, at a wavelength of 13.5 nm and given a thickness factor of 1.018, as a thin line the reflectivity values against the angles of incidence and as a thin bar the average reflectivity of the above-specified layer design for the angle of incidence interval of 17.8° to 27.2°, and also, given a thickness factor of 0.972, in a corresponding manner, as a thick line the reflectivity values against the angles of incidence and as a thick bar the average reflectivity of the above-specified layer design for the angle of incidence interval of 8.7° to 21.4°. Consequently, the layer arrangement is thicker than the nominal layer design by 1.8% at the mirror surface of the mirror 1c at the locations at which angles of incidence of between 17.8° and 27.2° have to be ensured and is correspondingly thinner than the nominal layer design by 2.8% at the locations at which angles of incidence of between 8.7° and 21.4° have to be ensured.

The average reflectivity and PV values which can be achieved by the layer arrangement with respect to FIG. 12 and FIG. 13 are compiled relative to the angle of incidence intervals and the thickness factors in Table 5. It can be discerned that the mirror 1c comprising the layer arrangement specified above, at a wavelength of 13.5 nm for angles of incidence of between 2.5° and 27.2°, has an average reflectivity of more than 39% and a variation of the reflectivity as PV value of less than or equal to 0.22.

TABLE 5

Average reflectivity and PV values of the layer design with respect to FIG. 12 and FIG. 13 relative to the angle of incidence interval in degrees and the thickness factor chosen.

| AOI Interval [°] | Thickness factor | R_average [%] | PV |
| --- | --- | --- | --- |
| 17.8-27.2 | 1.018 | 39.2 | 0.19 |
| 14.1-25.7 | 1 | 39.5 | 0.22 |
| 8.7-21.4 | 0.972 | 41.4 | 0.17 |
| 2.5-7.3 | 0.933 | 43.9 | 0.04 |

FIG. 14 shows reflectivity values for unpolarized radiation in the unit [%] of the fourth exemplary embodiment of a mirror according to the invention as a variant of the mirror 1c in which the order of the layers in the surface layer system P‴ has been reversed, plotted against the angle of incidence in the unit [°]. In this case, the surface layer system P″ of the layer arrangement of the mirror consists of $N_2$=6 periods $P_2$, wherein the period $P_2$ consists of 2.78 nm Si as high refractive index layer and 4.132 nm Mo as low refractive index layer, and also of two barrier layers each comprising 0.4 nm $B_4C$. The period $P_2$ consequently has a thickness $d_2$ of 7.712 nm. The surface layer system P‴ of the layer arrangement of the mirror consists of $N_3$=16 periods $P_3$, wherein the period $P_2$ consists of 3.608 nm Si as high refractive index layer and 3.142 nm Mo as low refractive index layer, and also of two barrier layers each comprising 0.4 nm $B_4C$. The period $P_3$ consequently has a thickness $d_3$ of 7.55 nm. The layer arrangement of the mirror is terminated by a covering layer system C consisting of 2.027 nm Si, 0.4 nm $B_4C$, 2 nm Mo and 1.5 nm Ru in the order specified. Consequently, the surface layer system P''' that is most distant from the substrate has a thickness of the high refractive index layer H''' which amounts to more than 120% of the thickness of the high refractive index layer H'' of the surface layer system P'' that is second most distant from the substrate. Furthermore, the surface layer system P''' that is most distant from the substrate has a number $N_3$ of periods $P_3$ that is greater than the number $N_2$ of periods $P_2$ for the surface layer system P'' that is second most distant from the substrate, and the first high refractive index layer H''' of the surface layer system P''' that is most distant from the substrate directly succeeds the last high refractive index layer H'' of the surface layer system P'' that is second most distant from the substrate.

The reflectivity values of this nominal layer design with the thickness factor 1 in the unit [%] at a wavelength of 13.5 nm are illustrated as a solid line against the angle of incidence in the unit [°] in FIG. 14. Moreover, the average reflectivity of this nominal layer design for the angle of incidence interval of 14.1° to 25.7° is depicted as a solid horizontal bar. Furthermore, FIG. 14 correspondingly specifies, at a wavelength of 13.5 nm and given a thickness factor of 0.933, as a dashed line the reflectivity values against the angles of incidence and as a dashed bar the average reflectivity of the above-specified layer design for the angle of incidence interval of 2.5° to 7.3°. Consequently, the thicknesses of the periods of the layer arrangement with respect to the reflectivity values illustrated as a dashed line in FIG. 14 amount to only 93.3% of the corresponding thicknesses of the periods of the nominal layer design. In other words, the layer arrangement is thinner than the nominal layer design by 6.7% at the mirror surface of the mirror according to the invention at the locations at which angles of incidence of between 2.5° and 7.3° have to be ensured.

FIG. 15 shows, at a wavelength of 13.5 nm and given a thickness factor of 1.018, in a manner corresponding to FIG. 14, as a thin line the reflectivity values against the angles of incidence and as a thin bar the average reflectivity of the above-specified layer design for the angle of incidence interval of 17.8° to 27.2°, and also, given a thickness factor of 0.972, in a corresponding manner, as a thick line the reflectivity values against the angles of incidence and as a thick bar the average reflectivity of the above-specified layer design for the angle of incidence interval of 8.7° to 21.4°. Consequently, the layer arrangement is thicker than the nominal layer design by 1.8% at the mirror surface of this mirror according to the invention at the locations at which angles of incidence of between 17.8° and 27.2° have to be ensured and is correspondingly thinner than the nominal layer design by 2.8% at the locations at which angles of incidence of between 8.7° and 21.4° have to be ensured.

The average reflectivity and PV values which can be achieved by the layer arrangement with respect to FIG. 14 and FIG. 15 are compiled relative to the angle of incidence intervals and the thickness factors in Table 6. It can be discerned that the mirror according to the invention comprising the layer arrangement specified above, at a wavelength of 13.5 nm for angles of incidence of between 2.5° and 27.2°, has an average reflectivity of more than 42% and a variation of the reflectivity as PV value of less than or equal to 0.24.

TABLE 6

Average reflectivity and PV values of the layer design with respect to FIG. 14 and FIG. 15 relative to the angle of incidence interval in degrees and the thickness factor chosen.

| AOI Interval [°] | Thickness factor | R_average [%] | PV |
|---|---|---|---|
| 17.8-27.2 | 1.018 | 42.4 | 0.18 |
| 14.1-25.7 | 1 | 42.8 | 0.24 |
| 8.7-21.4 | 0.972 | 44.9 | 0.15 |
| 2.5-7.3 | 0.933 | 42.3 | 0.04 |

In all four exemplary embodiments shown, the number of periods of the surface layer system that is respectively situated closest to the substrate can be increased in such a way that the transmission of EUV radiation through the surface layer systems is less than 2%, in particular less than 0.2%.

Firstly, it is thus possible, as already mentioned in the introduction, to avoid perturbing effects of the layers lying below the layer arrangement or of the substrate on the optical properties of the mirror, and in this case in particular on the reflectivity, and, secondly, it is thereby possible for layers lying below the layer arrangement or the substrate to be sufficiently protected from the EUV radiation.

The 18 clauses consecutively numbered below constitute further embodiments of the present invention, in accordance with the decision J15/88 of the Boards of Appeal of the European Patent Office. In particular, this holds true in combination with the patent claims of the present invention.

1. Mirror (1a; 1a'; 1b; 1b'; 1c; 1c;) for the EUV wavelength range comprising a substrate (S) and a layer arrangement, wherein the layer arrangement comprises a plurality of surface layer systems (P'', P''') each consisting of a periodic sequence of at least two periods ($P_2$, $P_3$) of individual layers, wherein the periods ($P_2$, $P_3$) comprise two individual layers composed of different materials for a high refractive index layer (H'', H''') and a low refractive index layer (L'', L''') and have within each surface layer system (P'', P''') a constant thickness ($d_2$, $d_3$) that deviates from a thickness of the periods of an adjacent surface layer system,
characterized in that the surface layer system (P''') that is second most distant from the substrate (S) has a sequence of the periods ($P_2$) such that the first high refractive index layer (H''') of the surface layer system (P''') that is most distant from the substrate (S) directly succeeds the last high refractive index layer (H'') of the surface layer system (P'') that is second most distant from the substrate and/or the surface layer system (P''') that is most distant from the substrate (S) has a number ($N_3$) of periods ($P_3$) that is greater than the number ($N_2$) of periods ($P_2$) for the surface layer system (P''') that is second most distant from the substrate (S).

2. Mirror (1a; 1a') for the EUV wavelength range comprising a substrate (S) and a layer arrangement, wherein the layer arrangement comprises a plurality of surface layer systems (P'', P''') each consisting of a periodic sequence of at least two periods ($P_2$, $P_3$) of individual layers, wherein the periods ($P_2$, $P_3$) comprise two individual layers composed of different materials for a high refractive index layer (H'', H''') and a low refractive index layer (L'', L''') and have within each surface layer system (P'', P''') a constant thickness ($d_2$, $d_3$) that deviates from a thickness of the periods of an adjacent surface layer system, characterized in that the surface layer system (P''') that is second most distant from the substrate (S) has a sequence of the periods ($P_2$) such that the first high refractive index layer (H''') of the surface layer system (P''') that is most distant from the substrate (S) directly succeeds the last high refractive index layer (H'') of the surface layer system (P'') that is second most distant from the substrate (S) and the transmission of EUV radiation through the surface layer systems (P'', P''') of the layer arrangement amounts to less than 10%, in particular less than 2%.

3. Mirror (1a; 1a'; 1b; 1b'; 1c; 1c') for the EUV wavelength range according to clause 1 or 2, wherein the surface layer systems (P'', P''') are constructed from the same materials for the high refractive index layer (H'', H''') and the low refractive index layer (L'', L''').

4. Mirror (1a; 1a'; 1b; 1b'; 1c; 1c') for the EUV wavelength range according to clause 1 or 2, wherein the number ($N_3$) of periods ($P_3$) of the surface layer system (P''') that is most distant from the substrate (S) amounts to between 9 and 16, and wherein the number ($N_2$) of periods ($P_2$) of the surface layer system (P'') that is second most distant from the substrate (S) amounts to between 2 and 12.

5. Mirror (1a; 1a'; 1b; 1b') for the EUV wavelength range according to clause 1 or 2, wherein the layer arrangement comprises at least three surface layer systems (P', P'', P''') and the number ($N_1$) of periods ($P_1$) of the surface layer system (P') that is situated closest to the substrate (S) is greater than for the surface layer system (P''') that is most distant from the substrate (S) and/or is greater than for the surface layer system (P'') that is second most distant from the substrate (S).

6. Mirror (1a; 1a'; 1c; 1c') for the EUV wavelength range according to clause 1 or 2, wherein the period ($P_3$) for the surface layer system (P''') that is most distant from the substrate (S) has a thickness of the high refractive index layer (H''') which amounts to more than 120% of the thickness, in particular more than double the thickness, of the high refractive index layer (H'') of the period ($P_2$) for the surface layer system (P'') that is second most distant from the substrate (S).

7. Mirror (1a; 1a'; 1c; 1c') for the EUV wavelength range according to clause 1 or 2, wherein the period ($P_3$) for the surface layer system (P''') that is most distant from the substrate (S) has a thickness of the low refractive index layer (L''') which is less than 80%, in particular less than two thirds, of the thickness of the low refractive index layer (L'') of the period ($P_2$) for the surface layer system (P'') that is second most distant from the substrate (S).

8. Mirror (1a; 1a'; 1c; 1c') for the EUV wavelength range according to clause 1 or 2, wherein the period ($P_2$) for the surface layer system (P'') that is second most distant from the substrate (S) has a thickness of the low refractive index layer (L'') that is greater than 4 nm, in particular greater than 5 nm.

9. Mirror (1a; 1a'; 1b; 1b'; 1c; 1c') for the EUV wavelength range according to clause 1 or 2, wherein the surface layer system (P''') that is most distant from the substrate (S) has a thickness ($d_3$) of the period ($P_3$) which amounts to between 7.2 nm and 7.7 nm.

10. Mirror (1a; 1a'; 1b; 1b'; 1c; 1c') for the EUV wavelength range according to clause 1 or 2, wherein an intermediate layer or an intermediate layer arrangement is provided between the layer arrangement and the substrate (S), and serves for the stress compensation of the layer arrangement.

11. Mirror (1a; 1a'; 1b; 1b'; 1c; 1c') for the EUV wavelength range according to clause 1 or 2, wherein a metal layer having a thickness of greater than 20 nm, in particular of greater than 50 nm, is provided between the layer arrangement and the substrate (S).

12. Mirror (1a; 1a'; 1b; 1b'; 1c; 1c') for the EUV wavelength range according to clause 1 or 2, wherein the materials of the two individual layers (L'', H'', L''', H''') forming the periods ($P_2$, $P_3$) are either molybdenum and silicon or ruthenium and silicon, and wherein the individual layers are separated by at least one barrier layer (B) and the barrier layer (B) consists of a material which is selected from or as a compound is composed of the group of materials: $B_4C$, C, Si nitride, Si carbide, Si boride, Mo nitride, Mo carbide, Mo boride, Ru nitride, Ru carbide and Ru boride.

13. Mirror (1a; 1a'; 1b; 1b'; 1c; 1c') for the EUV wavelength range according to clause 12, wherein the barrier layer (B) comprises the material $B_4C$ and has a thickness of between 0.35 nm and 0.8 nm, preferably between 0.4 nm and 0.6 nm.

14. Mirror (1a; 1a'; 1b; 1b'; 1c; 1c') for the EUV wavelength range according to clause 1 or 2, wherein a covering layer system (C) comprises at least one layer (M) composed of a chemically inert material and terminates the layer arrangement of the mirror.

15. Mirror (1a; 1a'; 1b; 1b'; 1c; 1c') for the EUV wavelength range according to clause 1 or 2, wherein a thickness factor of the layer arrangement along the mirror surface assumes values of between 0.9 and 1.05, in particular values of between 0.933 and 1.018.

16. Mirror (1a; 1a'; 1b; 1b'; 1c; 1c') for the EUV wavelength range according to clause 15, wherein the thickness factor of the layer arrangement at a location of the mirror surface correlates with the maximum angle of incidence that is to be ensured there.

17. Mirror (1a; 1a'; 1b; 1b') for the EUV wavelength range according to clause 1 or 2, wherein the layer arrangement comprises at least three surface layer systems (P', P'', P'''), and wherein the transmission of EUV radiation through the at least three surface layer systems (P', P'', P''') amounts to less than 10%, in particular less than 2%.

18. Mirror (1a; 1a') for the EUV wavelength range according to clause 2, wherein the surface layer systems (P'', P''') are constructed from the same materials for the high refractive index layer (H'', H''') and the low refractive index layer (L'', L'''), and the surface layer system (P''') that is most distant from the substrate (S) has a number ($N_3$) of periods ($P_3$) that is greater than the number ($N_2$) of periods ($P_2$) for the surface layer system (P'') that is second most distant from the substrate (S).

The above description of the preferred embodiments has been given by way of example. From the disclosure given, those skilled in the art will not only understand the present invention and its attendant advantages, but will also find apparent various changes and modifications to the structures disclosed. The applicant seeks, therefore, to cover all such changes and modifications as fall within the spirit and scope of the invention, as defined by the appended claims, and equivalents thereof.

The invention claimed is:

1. A mirror configured to reflect radiation in an extreme-ultraviolet (EUV) wavelength range, comprising:
   a substrate (S) and a layer arrangement, wherein the layer arrangement comprises a reflective portion and a surface protecting layer portion,
   wherein the reflective portion comprises at least one surface layer system (P''') consisting of a periodic sequence of at least two periods ($P_3$) of individual layers, wherein the periods ($P_3$) each comprise two individual layers composed of different materials for a high refractive index layer (H''') and a low refractive index layer (L''') such that the reflectivity of the reflective portion varies according to an angle of incidence of the EUV radiation, and
   wherein the surface protective layer portion is arranged between the reflective portion and substrate and comprises at least one surface protecting layer (SPL, $L_p$) or at least one surface protecting layer system (SPLS) having a thickness of greater than 20 nm, configured to absorb radiation in the EUV wavelength range such that the transmission of the EUV radiation through the layer arrangement amounts to less than 2%.

2. The mirror according to claim 1, wherein the layer arrangement comprises at least one layer which is formed from or as a compound is composed of an alloy from the group nickel-boron, nickel-silicon, nickel-molybdenum, nickel-vanadium, and nickel-silicon-boron.

3. The mirror according to claim 1, wherein the layer arrangement comprises at least three surface layer systems (SPL, P', P'', P''') and the number ($N_p$; $N_1$) of periods ($P_p$; $P_1$) of the surface layer system (SPL, P') that is situated closest to the substrate (S) is greater than for the surface layer system (P''') that is most distant from the substrate (S) and/or is greater than for the surface layer system (P'') that is second most distant from the substrate (S).

4. The mirror according to claim 1, wherein the materials of the two individual layers (L'', H'', L''', H''') forming the periods ($P_2$, $P_3$) are either molybdenum and silicon or ruthenium and silicon, and wherein a covering layer system (C) comprises at least one layer (M) composed of a chemically inert material and terminates the layer arrangement of the mirror.

5. The mirror according to claim 1, wherein a thickness factor of the layer arrangement along the mirror surface assumes values of between 0.9 and 1.05, and at a location of the mirror surface correlates with the maximum angle of incidence that is to be ensured there.

6. The mirror according to claim 1, wherein the thickness of the at least one surface protecting layer (SPL, $L_p$) or of the at least one surface protecting layer system (SPLS) is greater than 50 nm, and wherein the transmission of the EUV radiation through the layer arrangement amounts to less than 0.2%.

7. The mirror according to claim 1, wherein the layer arrangement comprises at least one layer which is formed from or as a compound is composed of a material from the group consisting of nickel, carbon, boron carbide, cobalt, beryllium, silicon, and silicon oxides.

8. The mirror according to claim 1, wherein the at least one surface protecting layer (SPL, Lp) or at the least one surface protecting layer system (SPLS) is adjacent to the substrate.

9. The mirror according to claim 1, wherein the layer arrangement comprises an amorphous layer comprising at least quartz or silicon having a thickness of greater than 100 nm, deposited by a CVD method.

10. The mirror according to claim 9, wherein the amorphous layer has a surface roughness of less than 0.5 nm rms HSFR.

11. The mirror according to claim 1, wherein the layer arrangement comprises at least one surface protecting layer system (SPLS) consisting of a periodic sequence of at least two periods ($P_p$) of individual layers, wherein the periods ($P_p$) comprise two individual layers composed of different materials for a low refractive index layer ($L_p$) and a barrier layer (B).

12. The mirror according to claim 11, wherein the material for the low refractive index layer ($L_p$) consists of nickel and the material for the barrier layer (B) is selected from or as a compound is composed of the group of materials: $B_4C$, C, Si nitride, Si carbide, Si boride, Mo nitride, Mo carbide, Mo boride, Ru nitride, Ru carbide and Ru boride.

13. A projection objective for microlithography comprising a mirror according to claim 1.

14. A projection exposure apparatus for microlithography comprising a projection objective according to claim 13.

15. The mirror according to claim 1, wherein the layer arrangement comprises at least one surface protecting layer system (SPLS) consisting of a periodic sequence of at least two periods ($P_p$) of individual layers, where the periods ($P_p$) comprise two individual layers composed of different materials for a high refractive index layer ($H_p$) and a low refractive index layer ($L_p$), wherein the materials of the two individual layers ($L_p$, $H_p$) forming the periods ($P_p$) are either nickel and silicon or cobalt and beryllium.

16. The mirror according to claim 15, wherein the individual layers are separated by at least one barrier layer (B) and the barrier layer (B) consists of a material which is selected from or as a compound is composed of the group of materials: $B_4C$, C, Si nitride, Si carbide, Si boride, Mo nitride, Mo carbide, Mo boride, Ru nitride, Ru carbide and Ru boride.

17. The mirror according to claim 15, wherein the at least one surface protecting layer system (SPLS) has layers having a surface roughness of less than 0.5 nm HSFR rms.

18. A mirror configured to reflect radiation in an extreme-ultraviolet (EUV) wavelength range, comprising:
   a substrate (S) and a layer arrangement, wherein the layer arrangement comprises at least one surface layer system (P''') consisting of a periodic sequence of at least two periods ($P_3$) of individual layers, wherein the periods ($P_3$) each comprise two individual layers composed of different materials for a high refractive index layer (H''') and a low refractive index layer (L'''),
   wherein the layer arrangement comprises at least one surface protecting layer (SPL, $L_p$) or at least one surface protecting layer system (SPLS) having a thickness of greater than 20 nm, wherein the surface protecting layer (SPL, $L_p$) or the surface protecting layer system (SPLS) is configured to absorb radiation in the EUV wavelength range and experiences an irreversible change in volume of less than 1% under EUV radiation.

19. The mirror according to claim 18, wherein the thickness of the at least one surface protecting layer (SPL, $L_p$) or of the at least one surface protecting layer system (SPLS) is greater than 50 nm, and wherein the surface protecting layer (SPL, $L_p$) or the surface protecting layer system (SPLS) experiences an irreversible change in volume of less than 0.2% under the EUV radiation.

20. The mirror according to claim 18, wherein the layer arrangement comprises at least one layer which is formed from or as a compound is composed of an alloy from the group nickel-boron, nickel-silicon, nickel-molybdenum, nickel-vanadium, and nickel-silicon-boron.

21. The mirror according to claim 18, wherein the layer arrangement comprises at least one layer which is formed from or as a compound is composed of a material from the group consisting of nickel, carbon, boron carbide, cobalt, beryllium, silicon, and silicon oxides.

22. The mirror according to claim 18, wherein the at least one surface protecting layer (SPL, Lp) or at the least one surface protecting layer system (SPLS) is adjacent to the substrate.

23. A mirror configured to reflect radiation in an extreme-ultraviolet (EUV) wavelength range, comprising:
   a substrate (S) and a layer arrangement, wherein the layer arrangement comprises at least one surface layer system (P''') consisting of a periodic sequence of at least two periods ($P_3$) of individual layers, wherein the periods ($P_3$) each comprise two individual layers composed of different materials for a high refractive index layer (H''') and a low refractive index layer (L'''),
   wherein the layer arrangement comprises at least one surface protecting layer (SPL, $L_p$) or at least one surface protecting layer system (SPLS) having a thickness of greater than 20 nm, wherein the surface protecting layer (SPL, $L_p$) or the surface protecting layer system (SPLS) is configured to absorb radiation in the EUV wavelength range and prevents an irreversible alteration of the surface of the substrate (S) under the EUV radiation of more than 0.1 nm measured in the normal direction at a location within the irradiated region of the substrate (S) relative to the surface of the substrate (S) at a location outside the irradiated region measured in the same direction and exerts a tensile stress at least partly compensating layer stresses in the layer arrangement.

24. The mirror according to claim 23, wherein the thickness of the at least one surface protecting layer (SPL, $L_p$) or of the at least one surface protecting layer system (SPLS) is greater than 50 nm.

25. The mirror according to claim 23, wherein the layer arrangement comprises at least one layer which is formed from or as a compound is composed of an alloy from the group nickel-boron, nickel-silicon, nickel-molybdenum, nickel-vanadium, and nickel-silicon-boron.

26. The mirror according to claim 23, wherein the layer arrangement comprises at least one layer which is formed from or as a compound is composed of a material from the group consisting of nickel, carbon, boron carbide, cobalt, beryllium, silicon, and silicon oxides.

27. The mirror according to claim 23, wherein the at least one surface protecting layer (SPL, Lp) or at the least one surface protecting layer system (SPLS) is adjacent to the substrate.

* * * * *